United States Patent
Chikuma et al.

(10) Patent No.: US 6,711,192 B1
(45) Date of Patent: Mar. 23, 2004

(54) NITRIDE SEMICONDUCTOR LASER AND METHOD OF FABRICATING THE SAME

(75) Inventors: Kiyofumi Chikuma, Tsurugashima (JP); Hiroyuki Ota, Tsurugashima (JP); Toshiyuki Tanaka, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/567,024

(22) Filed: May 9, 2000

(30) Foreign Application Priority Data

May 10, 1999 (JP) .......................................... 11-128769

(51) Int. Cl.[7] ................................................ H01S 5/00
(52) U.S. Cl. ............................ 372/43; 372/44; 372/45
(58) Field of Search ................................ 372/43–45, 36

(56) References Cited

U.S. PATENT DOCUMENTS

| | | | | |
|---|---|---|---|---|
| 5,949,808 A | * | 9/1999 | Fujihara et al. | 372/46 |
| 5,953,362 A | * | 9/1999 | Pamulapati et al. | 372/45 |
| 6,069,021 A | * | 5/2000 | Terashima et al. | 438/46 |
| 6,113,685 A | * | 9/2000 | Wang et al. | 117/3 |
| 6,154,476 A | * | 11/2000 | Nishiguchi et al. | 372/46 |
| 6,320,206 B1 | * | 11/2001 | Coman et al. | 372/46 |
| 6,377,596 B1 | * | 4/2002 | Tanaka et al. | 372/45 |

FOREIGN PATENT DOCUMENTS

| | | | | |
|---|---|---|---|---|
| DE | 100 00 088 A1 | * | 8/2000 | H01L/33/00 |
| DE | 199 53 609 | * | 8/2000 | H01S/5/125 |
| EP | 1014520 A1 | | 6/2000 | |

OTHER PUBLICATIONS

Shuji Nakamura; "First III–V–nitride–based violet laser diodes"; Journal of Crystal Growth; vol. 170, 1997, pp. 11–15.

* cited by examiner

Primary Examiner—Paul Ip
Assistant Examiner—James Menefee
(74) Attorney, Agent, or Firm—Sughrue Mion, PLLC

(57) ABSTRACT

A method for fabricating a nitride semiconductor laser device having crystal layers each made of a group III nitride semiconductor $(Al_xGa_{1-x})_{1-y}In_yN$ ($0 \leq x \leq 1$, $0 \leq y \leq 1$) layered in order on a ground layer $(Al_{x'}Ga_{1-x'})_{1-y'}In_{y'}N$ ($0 \leq x' \leq 1$, $0 \leq y' \leq 1$). The method including a step of forming a plurality of crystal layers each made of group III nitride semiconductor on a ground layer formed on a substrate such as sapphire; a step of applying a light beam from the substrate side toward the interface between the substrate and the ground layer thereby forming the decomposed-matter area of a nitride semiconductor; a step of separating the ground layer carrying the crystal layers from the substrate along the decomposed-matter area; and a step of cleaving the ground layer thereby forming a cleavage plane of the crystal layers.

8 Claims, 22 Drawing Sheets

NITRIDE SEMICONDUCTOR LASER AND METHOD OF FABRICATING THE SAME

BACKGROUND OF THE INVENTION

1. Field of the Invention

The present invention relates to a group III nitride semiconductor device (hereafter also referred to as a device simply) and, particularly to a fabrication method of a semiconductor laser device using the same material system.

2. Description of the Related Art

A laser device needs to have a resonator consisting of a pair of flat parallel mirror facets for its operation. For example, in the case of the manufacture of a conventional laser device (Fabry-Perot type) using a semiconductor crystal material such as GaAs, the cleavage nature of GaAs crystal i.e., the substrate crystal is utilized for the fabrication of the mirror facets.

In the case of a group III nitride semiconductor device, it is inevitable to perform the epitaxial-growth of the crystal film onto a dissimilar substrate such as sapphire, SiC or the like, because a nitride bulk crystal is extremely expensive to be used in practice although it could be manufactured.

SiC is not frequently used as a substrate for the nitride devices, because SiC substrates are also expensive and a nitride film on the SiC substrate easily cracks due to the difference in thermal expansion coefficient therebetween. Thus sapphire is commonly used as a substrate for the group III nitride semiconductor laser devices. In the case of epitaxial growth of nitrides on a sapphire substrate, a high quality single-crystal film is obtained on a C-face i.e., (0001) plane of sapphire, or on an A-face, i.e., (11$\bar{2}$0) plane (hereafter referred to as (11-20) plane) of sapphire.

The mirror facets may be formed by an etching process such as reactive ion etching (RIE) instead of cleavage, because it is hard to split the sapphire substrate to laser bars in comparison with the GaAs substrate having been used so far for semiconductor laser devices.

Reactive ion etching is mainly used as a method for obtaining the mirror facets of the nitride semiconductor laser on the sapphire substrate at present. However, the resultant device with the mirror facets formed by the reactive ion etching method has a disadvantage that the far-field pattern of its emitted light exhibits multiple spots. The mass-production-type GaN laser with the cleaved mirror facets is studied again in view of overcoming the multiple spots phenomenon in the far field pattern as mentioned above.

It is a matter of course that the cleavage cannot be preferably performed on sapphire in mass production. Therefore, the following method have been used. First, after forming a thick ground layer of GaN film e.g., at approximately 200 μm thickness on a sapphire substrate, the backside of the sapphire substrate of the obtained wafer is ground or lapped to remove the sapphire portion, so that the GaN substrate is obtained. Next, the epitaxial growth of laser structure is preformed on the GaN substrate. From the obtained wafer, laser devices may be fabricated.

However, the conventional method of lapping the back side the sapphire substrate backside as described above requires many steps, and is complicated. As a result, the method invites a very low yield of the group III nitride semiconductor devices. Such a method is not suitable for mass production.

Although sapphire does not have a definite cleavage plane like a Si or GaAs wafer, a C-face sapphire is fairly easily split along its 1$\bar{1}$00) plane (hereafter referred to as (1-100) plane), and also an A-face sapphire can be easily parted along its (1$\bar{1}$02) plane (hereafter referred to as (1-102) plane), so called R-plane, considerably close to the cleavage of ordinary crystal. It is considered that the formation of the mirror facets of nitride semiconductor lasers on a sapphire substrate may be achieved through following methods: First is a method of growing nitride semiconductor layers on a C-face sapphire substrate and then splitting the wafer along (1-100) plane of the sapphire substrate. Second is a method of growing nitride semiconductor layers on an A-face sapphire substrate and then splitting the wafer along (1-102) plane of the sapphire substrate.

As to the first method of mirror facet formation applied to the device grown on a C-face sapphire substrate, there are problems that a sapphire substrate cannot be split unless the substrate is made thin enough by lapping down the backside of the substrate and that it does not have high reproducibility. These problems are caused by the fact that (1-100) plane of sapphire is not an explicit cleavage plane. Since sapphire is very hard crystal, it cannot be split exactly along a line notched on its surface unless it is made thin enough, and the thickness of the sapphire substrate should be reduced to approximately 100 μm in order to obtain mirror facets practical for laser devices. When lapping the backside of a wafer on which a device structure is already formed, the wafer is warped or distorted due to the difference between thermal expansion coefficients of sapphire and nitrides or due to the residual stress caused by lapping process. When the back of a device wafer is lapped, the wafer is thereby apt to fracture during the process. This is very disadvantageous for mass production. The (1-100) plane of sapphire is not a cleavage plane. Therefore, in many cases GaN is split along in a direction slightly deviated from the cleavage plane thereof, the fracture surface consists of many facts of (1-100) planes of GaN, each of which is the cleavage plane, forming a stepwise appearance. The stepwise appearance causes degradation of the reflectivity and perturbation of the wave front of emitted light and, thereby deteriorates the quality of mirror facets for optical resonance of a laser device.

Whereas, the second method of mirror facet forming method applied to the device formed on an A-face sapphire substrate has a problem that the quality of the fracture plane of GaN is not sufficient.

Since the sapphire substrate can be easily split along its cleavage plane (1-102), so called R-plane, it is possible to cleave the sapphire having a thickness of 250 to 350 μm normally used as a substrate. However, as shown in FIG. 1, when forming a laser structure on the A-face of a sapphire substrate and parting sapphire along its R-plane as depicted by the arrow in the figure, fine striations are formed on the side surface of GaN layers. This is caused by the following reason that the laser wafer splits along the R-plane of the sapphire since a major part of the wafer is made of sapphire. The R-plane of sapphire tilts by an angle of 2.40 from (1-100) plane of the grown GaN as shown in FIG. 2, after a propagating crack along the sapphire's R-plane reaches at the sapphire-GaN interface, the crack still propagates into GaN still along the R-plane of sapphire up to a certain depth. However, GaN tends to crack on its crystallographic cleavage plane (1-100). Therefore, a plurality of (1-100) facets of GaN are formed in such a stepwise manner that the striations appear on the fracture plane of GaN as shown in FIG. 1.

As a result, in the case of the A-face sapphire substrate, the quality of fracture plane is not very good though it is reproducible.

OBJECT AND SUMMARY OF THE INVENTION

Therefore, an object of the present invention is to provide a group III nitride-semiconductor laser having high-quality mirror facets for a laser structure and a method of fabricating the laser device with high reproducibility.

A fabrication method according to the present invention is a method for producing a nitride semiconductor laser device having crystal layers each made of a group III nitride semiconductor $(A_xGa_{1-x})_{1-y}In_yN$ ($0 \leq x \leq 1$, $0 \leq y \leq 1$), layered in order on a ground layer $(Al_{x'}Ga_{1-x'})_{1-y'}In_{y'}N$ ($0 \leq x' \leq 1$, $0 \leq y' \leq 1$), the comprising the steps of:

forming a plurality of crystal layers each made of group III nitride semiconductor on a ground layer formed on a substrate, the crystal layers including an active layer;

applying a light beam from the substrate side toward the interface between the substrate and the ground layer thereby forming the decomposed-matter area of a nitride semiconductor;

separating the ground layer with the crystal layers thereon from the substrate along the decomposed-matter area; and cleaving the ground layer thereby forming a cleavage plane of the crystal layers for a laser resonator.

In an aspect of the fabrication method according to the invention, the wavelength of said light beam is selected from wavelengths passing through the substrate and absorbed by the ground layer in the vicinity of the interface.

In another aspect of the fabrication method according to the invention, the method further comprises, between said step of forming the crystal layers and said step of applying the light beam toward the interface, a step of bonding a cleavable second substrate onto a surface of the crystal layers in such a manner that a cleavage plane of the second substrate substantially coincides with a cleavage plane of the crystal layers of the nitride semiconductor.

As to a further aspect of the fabrication method according to the invention, in the step of applying the light beam toward the interface, the light beam is applied uniformly or entirely onto the interface between the substrate and the ground layer.

As to a still further aspect of the fabrication method according to the invention, in the step of applying the light beam toward the interface, the interface between the substrate and the ground layer is scanned with a spot or line of the light beam.

In another aspect of the fabrication method according to the invention, the method further comprises a step of forming a waveguide extending along a direction normal to the cleavage plane of the nitride semiconductor.

In a further aspect of the fabrication method according to the invention, the crystal layers of the nitride semiconductor are formed by metal-organic chemical vapor deposition.

As to a still further aspect of the fabrication method according to the invention, in the step of applying the light beam toward the interface, the light beam is an ultraviolet ray generated from a frequency quadrupled YAG laser.

In addition, a nitride semiconductor laser device according to the present invention having successively grown crystal layers each made of a group III nitride semiconductor $(Al_xGa_{1-x})_{1-y}In_yN$ ($0 \leq x \leq 1$, $0 \leq y \leq 1$) comprises:

a ground layer made of group III nitride semiconductor $(Al_{x'}Ga_{1-x'})_{1-y'}In_{y'}N$ ($0 \leq x' \leq 1$, $0 \leq y' \leq 1$);

a plurality of crystal layers each made of group III nitride semiconductor formed on the ground layer;

a cleavable substrate bonded onto a surface of the crystal layers opposite to the ground layer.

In another aspect of the nitride semiconductor laser device according to the invention, the device further comprises a heat sink bonded onto the ground layer.

In a further aspect of the nitride semiconductor laser device according to the invention, the device further comprises a heat sink bonded onto the cleavable substrate.

In a still further aspect of the nitride semiconductor laser device according to the invention, the cleavable substrate has a cleavage plane coinciding with a cleavage plane of the crystal layers of the nitride semiconductor.

In another aspect of the nitride semiconductor laser device according to the invention, the device further comprises a waveguide extending along a direction normal to the cleavage plane of the nitride semiconductor.

In a further aspect of the nitride semiconductor laser device according to the invention, the cleavable substrate is made of semiconductor single-crystal such as GaAs.

In a still further aspect of the nitride semiconductor laser device according to the invention, the cleavable substrate is made of an electrically conductive material.

According to the present invention, it is possible to obtain high-quality mirror facets by untying the crystal bond between the sapphire substrate and the ground layer of GaN crystal and separating the substrate and the ground layer and thereby, fabricating the laser device with high reproducibility.

DETAILED DESCRIPTION OF THE PREFERRED EMBODIMENTS

Embodiments of group III nitride semiconductor laser devices according to the present invention are described below by referring to the accompanying drawings.

Figure 1:
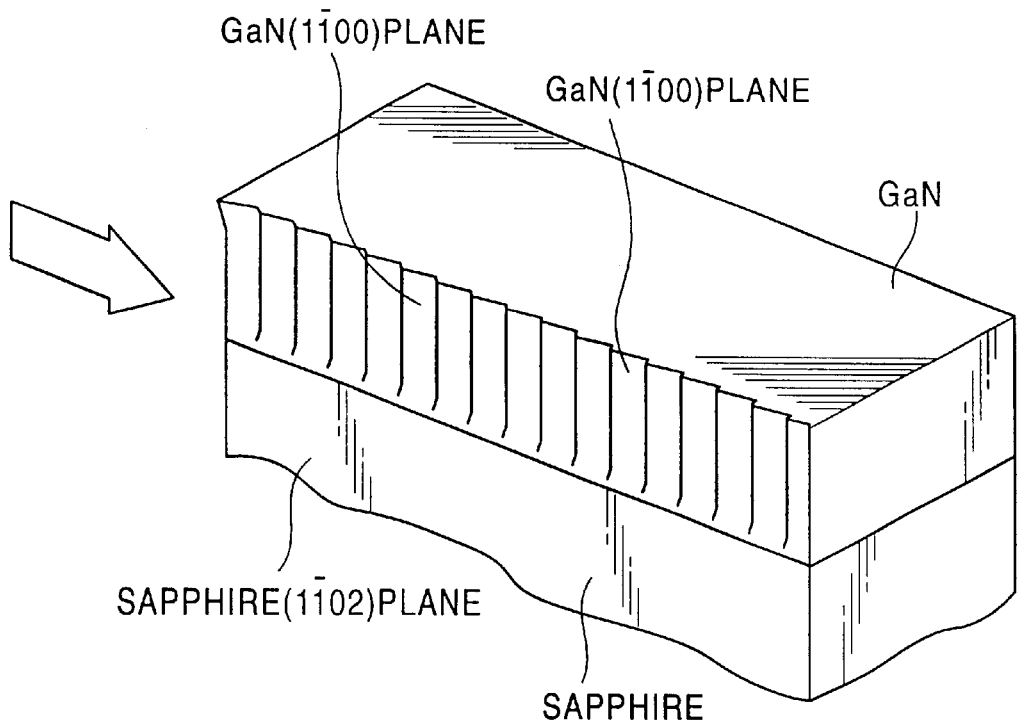
FIG. 1 is a schematic perspective view showing the fractured plane of a GaN crystal layer formed on a sapphire substrate.
Figure 2:
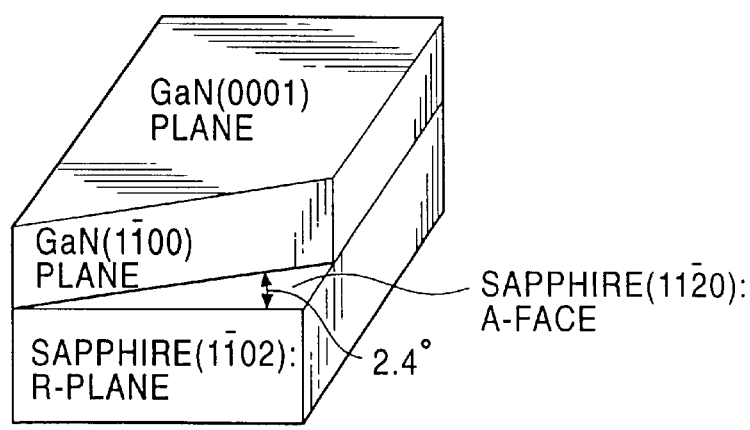
FIG. 2 is a schematic perspective view showing the lattice plane of a GaN crystal layer formed on a sapphire substrate.
Figure 3:
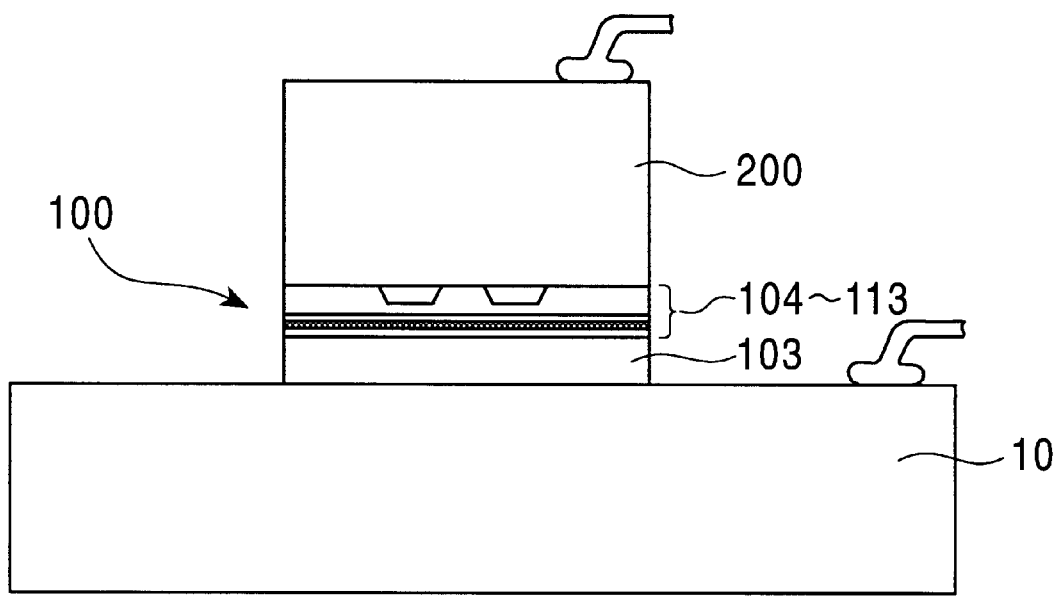
FIG. 3 is a schematic sectional view of a group III nitride-semiconductor laser device of an embodiment according to the present invention.

FIG. 3 generally shows an embodiment of the group III nitride semiconductor laser device of a refractive index guided type according to the invention. This device is constructed with a laser body 100, a support substrate 200 bonded onto the laser body 100, and a chip carrier 10 bonded onto the laser body 100 serving as a heat sink. The chip carrier 10 is made of an electrically conductive material. The laser body 100 comprises a ground layer 103 made of group III nitride semiconductor according $(Al_xGa_{1-x})_{1-y}In_yN$ ($0 \leq x' \leq 1$, $0 \leq y' \leq 1$), crystal layers 104 to 110 each made of a group III nitride semiconductor $(Al_xGa_{1-x})_{1-y}In_yN$ ($0 \leq x \leq 1$, $0 \leq y \leq 1$) successively grown in order on the ground layer, and an electrode layer 113. The crystal layers include an active layer. The support substrate 200 is a cleavable or partable substrate made of an electrically conductive material or preferably semiconductor single-crystal such as GaAs, InP, Si, or the like. The support substrate 200 is bonded to a surface of the crystal layers opposite to the ground layer 103 via the electrode layer 113. A cleavage plane of the support substrate 200 coincides with a cleavage plane of the crystal layers of the nitride semiconductor. Namely, the support substrate 200 is bonded to the surface of the crystal layers in such a manner that the cleavage plane of the second substrate substantially coincides with a cleavage plane of the crystal layers of the nitride semiconductor. The surface of the ground layer 103 of the laser body 100 is bonded onto the chip carrier 10 via which the device is electrically connected to an external electrode. The laser body 100 has a ridge waveguide extending along a direction normal to the cleavage plane of the nitride semiconductor layers 103 to 110 (which is the direction normal to the drawing).

Figure 4:
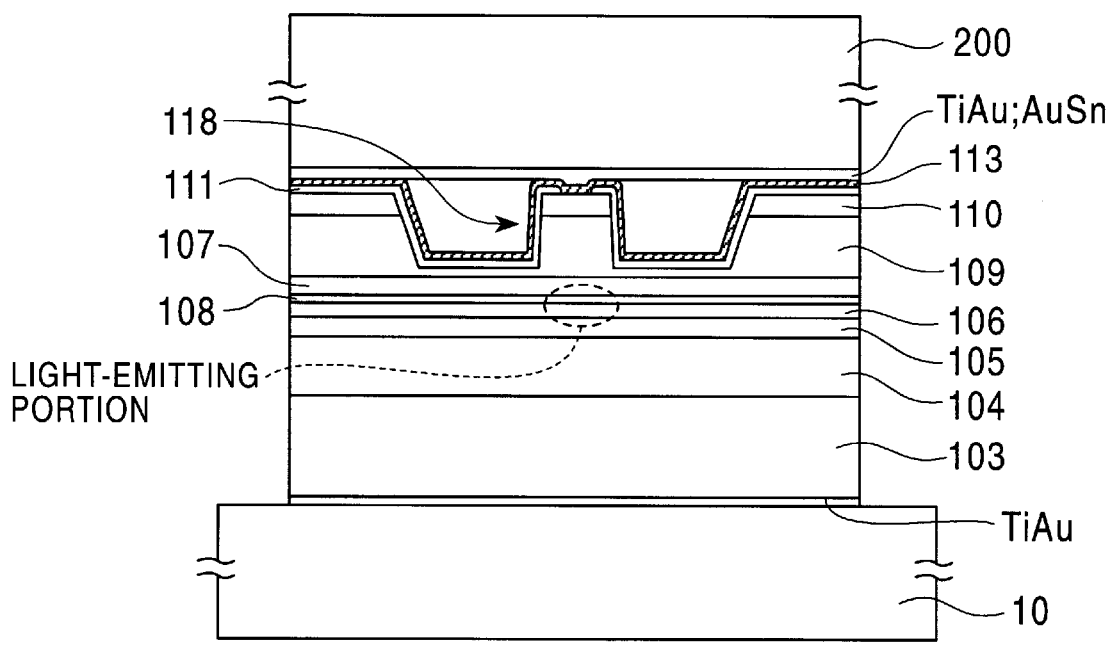
FIG. 4 is an enlarged schematic sectional view of a group III nitride-semiconductor laser device of an embodiment according to the present invention, which is seen from the mirror facet for optical resonance.

As shown in FIG. 4, the laser body 100 of the semiconductor laser device is constituted of the ground layer 103 i.e., n-type GaN layer 103, an n-type $Al_{0.1}Ga_{0.9}N$ layer 104, an n-type GaN layer 105, an active layer 106 mainly containing InGaN, a p-type $Al_{0.2}Ga_{0.8}N$ layer 107, a p-type GaN layer 108, a p-type $Al_{0.1}Ga_{0.9}N$ layer 109, and a p-type GaN contact layer 110 which are layered on the ground layer 103 in this order. A ridge stripe portion 118 is formed in the p-type $Al_{0.1}Ga_{0.9}N$ layer 109 and the p-type GaN contact layer 110 so as to extend along a direction normal to the cleavage plane of the nitride semiconductor layers. The top of the laser body 100 is covered with and protected by an insulating film 111 made of $SiO_2$ except a contact window to the p-type GaN contact layer 110 of the ridge stripe portion 118. The insulating film 111 is covered with the p-side electrode layer 113. The n-type GaN ground layer 103 is connected to the chip carrier 10. The p-side electrode 113 connected through a slit of the insulating film 111 to the p-type GaN contact layer 110 is connected to the support substrate 200 via a metal film.

The semiconductor laser device emits light by recombining electrons with holes in the active layer 106. The n-type GaN layer 10 and p-type GaN layer 108 serve as guiding layers. Light generated in the active layer 106 is guided in the guiding layers 105 and 108. Electrons and holes are effectively confined into the active layer 106 by setting band gaps of the guiding layers 105 and 108 to values larger than that of the active layer 106. The p-type $Al_{0.2}Ga_{0.8}N$ layer 107 serves as a barrier layer for further enhancing the confinement of carriers (particularly, electrons), the n-type $Al_{0.1}Ga_{0.9}N$ layer 104 and the p-type $Al_{0.1}Ga_{0.9}N$ layer 109 serve as cladding layers respectively each formed to have refractive indexes lower than those of the guiding layers 105 and 108. The wave-guiding in the lateral direction is performed by the difference between refractive indexes of the cladding layer and the guiding layer. The ridge stripe portion 118 is formed in order to produce a lateral-directional step in effective refractive index by changing the thickness of the cladding layer 109, thereby confining the generated light in the lateral direction.

The device structure shown in FIGS. 3 and 4 is fabricated in the following fabricating steps in which layered structure for a laser device is formed through the metal-organic chemical vapor deposition (MOCVD) on an A-face sapphire substrate whose both sides are mirror-finished.

<Preparation of a Laser Wafer>

Figure 5:
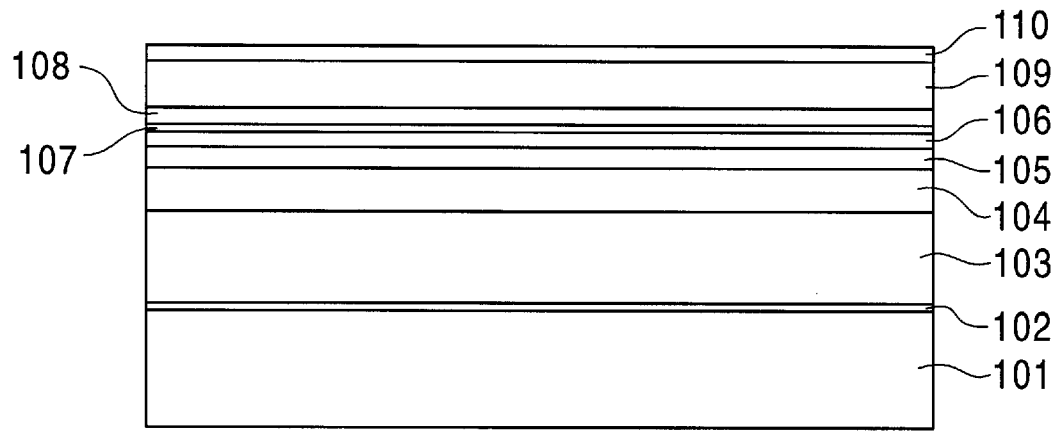
FIGS. 5 and 6 are schematic sectional views each showing a portion of a wafer for the semiconductor laser device at each fabricating step of an embodiment of the present invention.

FIG. 5 shows a sectional view of a target laser wafer prepared through the following steps in which crystal layers for a GaN semiconductor laser structure are grown on a sapphire substrate.

First, a sapphire substrate 101 is set into an MOCVD reactor and held for 10 minutes in a hydrogen-gas flow at a pressure of 300 Torr and a temperature of 1050° C. to thermally clean the surface of the sapphire substrate 101. Thereafter, the temperature of the sapphire substrate 101 is lowered to 600° C., and ammonia ($NH_3$) which is a nitrogen precursor and TMA (trimethyl aluminium) which is an Al precursor are introduced into the reactor to deposit a buffer layer 102 made of AlN up to a thickness of 20 nm. The GaN (or AlN) layer 102 formed at a low temperature acts as a buffer layer to ensure a growth of GaN film on the sapphire substrate which is a dissimilar material to GaN.

Subsequently, the supply of TMA is stopped, the temperature of the sapphire substrate 101 on which the buffer layer 102 is formed is raised to 1050° C. again while flowing only $NH_3$, and trimethyl gallium is introduced to form the n-type GaN ground layer 103 on the buffer layer 102. In this case, Me—$SiH_3$ (methyl silane) is added into a growth atmosphere gas as the precursor of Si which serves as an n-type impurity.

When the n-type GaN ground layer 103 is grown up to approximately 4 μm, TMA is introduced to form the n-type AlGaN cladding layer 104. When the n-type AlGaN cladding layer 104 is grown up to approximately 0.5 μm, the supply of TMA is stopped to growthen-type GaN guiding layer 105 up to 0.1 μm. When growth of the n-type GaN guiding layer 105 is completed, the supply of TMG and Me—$SiH_3$ is stopped, and lowering of temperature is started to set the substrate temperature at 750° C.

When the substrate temperature reaches to 750° C., carrier gas is switched from hydrogen to nitrogen. When the gas-flow state is stabilized, TMG, TMI, and Me—$SiH_3$ are introduced for growing a barrier layer in the active layer 106. Subsequently, the supply of Me—$SiH_3$ is stopped and then the flow rate of TMI is increased so that a well layer having an In composition ratio greater than that of the barrier layer is grown on the barrier layer. The growths of the barrier layer and the well layer are repeated in pairs in accordance with the number of wells in the designed multiple quantum well structure. In this way, the active layer 106 of the multiple quantum well structure is formed.

When the growth of active layer is finished, the supply of TMG, TMI, and Me—SiH$_3$ is stopped, and the carrier gas is switched from nitrogen to hydrogen. When the gas-flow is stabilized, the substrate temperature is raised to 1050° C. again and TMG, TMA, and Et—CP$_2$Mg (ethyl cyclopentadienyl magnesium) as the precursor of Mg which serves as a p-type impurity are introduced to form the p-type AlGaN layer 107 on the active layer 106 up to 0.01 μm. Then, the supply of TMA is stopped to grow the p-type GaN guiding layer 108 up to 0.1 μm and TMA is introduced again to grow the p-type AlGaN cladding layer 109 up to 0.5 μm. Moreover, the p-type GaN contact layer 110 is grown on the layer 109 up to 0.1 μm. Thereafter, the supply of TMG and Et—CP$_2$Mg is stopped and temperature lowering is started. When the substrate temperature reaches 400° C., the supply of NH$_3$ is also stopped. When the substrate temperature reaches room temperature, the sapphire substrate 101 is taken out of the reactor.

The obtained wafer is set into a heat treatment furnace to apply heat treatment for the p-type conversion.

In this way, the laser wafer shown in FIG. 5 is prepared.

<Formation of Ridge Waveguide>

Figure 6:
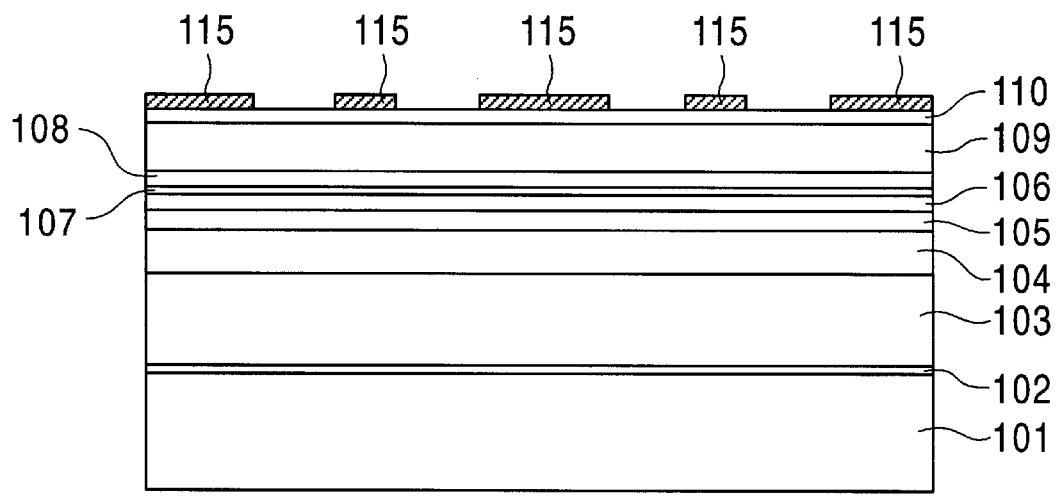

A ridge waveguide is formed as the index-guided type structure on the prepared laser wafer through the following steps:

As shown in FIG. 6, a mask 115 having a plurality of slits parallel to each other is formed on the surface of the p-type GaN contact layer 110, and the exposed area of the nitride semiconductor layer is partially etched by reactive ion etching (RIE).

Figure 7:
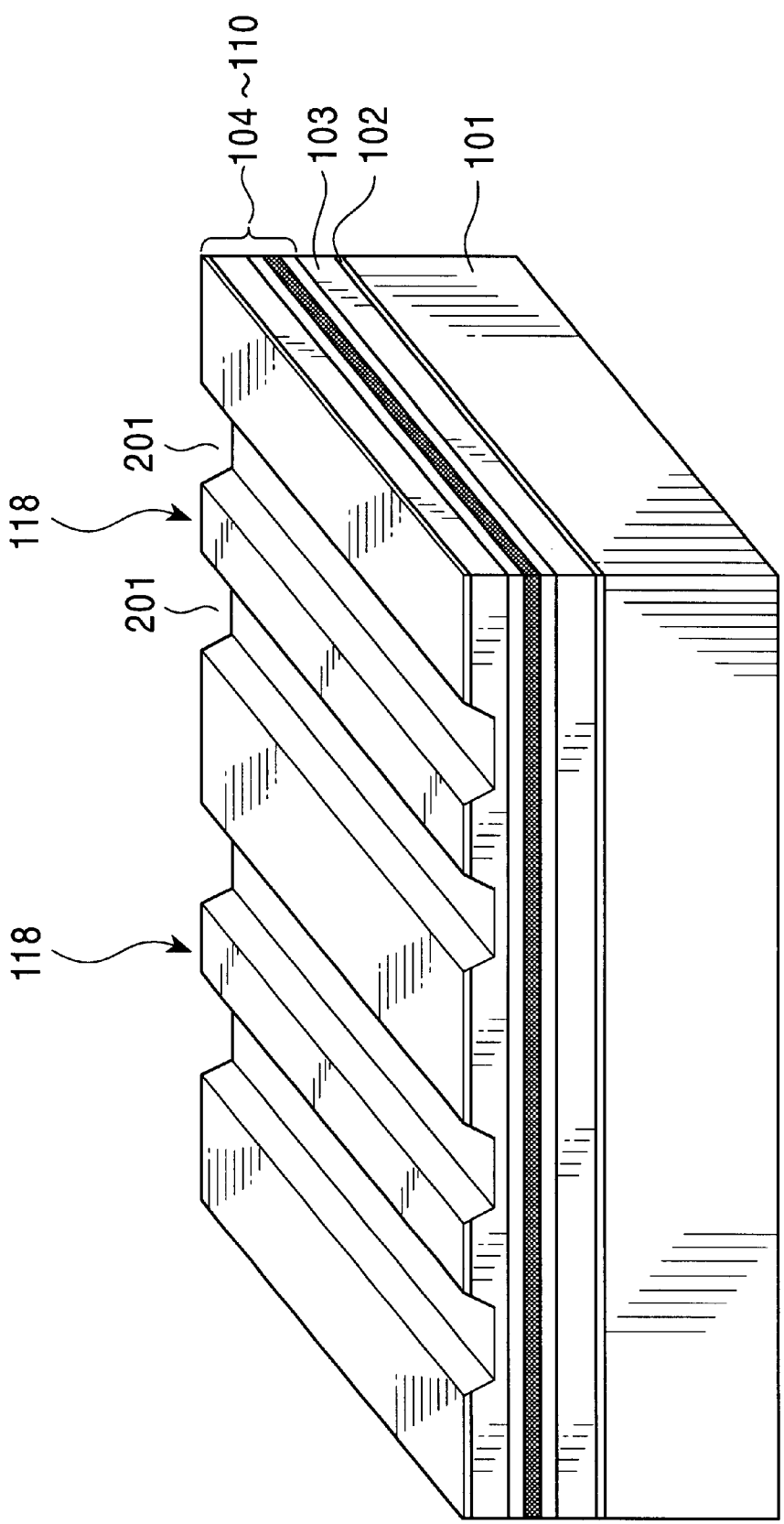
FIGS. 7 to 9 are schematic perspective views each showing a portion of a wafer for the semiconductor laser device at each fabricating step of an embodiment of the present invention.

In this case, as shown in FIG. 7, the etching is performed down to a depth where the p-type AlGaN cladding layer 109 is slightly left to form a recessed portion 201. Then, the mask 115 is removed to form narrow ridge structures 118 of 5 μm-wide extending parallel to each other. FIG. 7 shows two narrow ridge structures 118.

Figure 8:
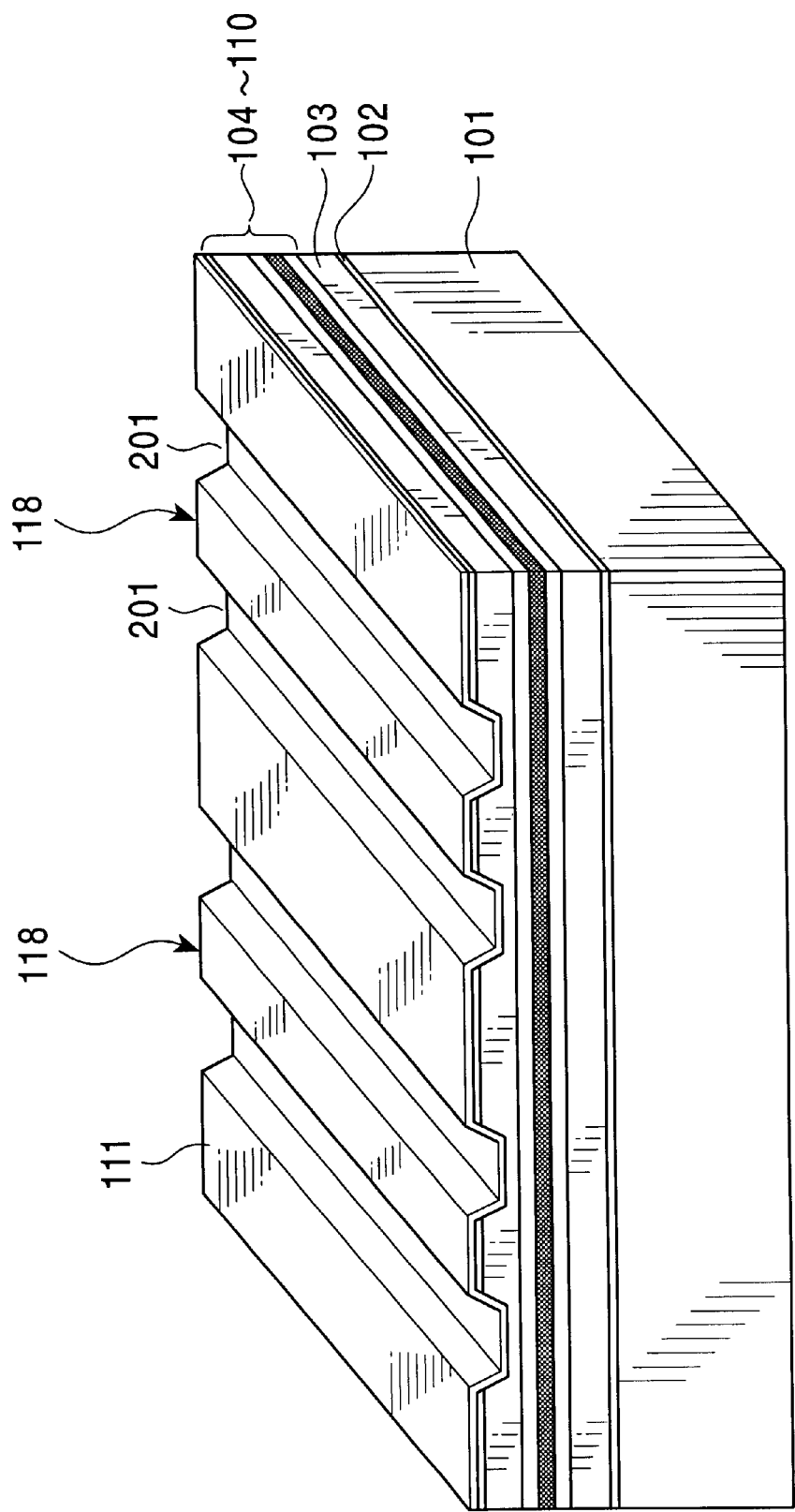
Figure 9:
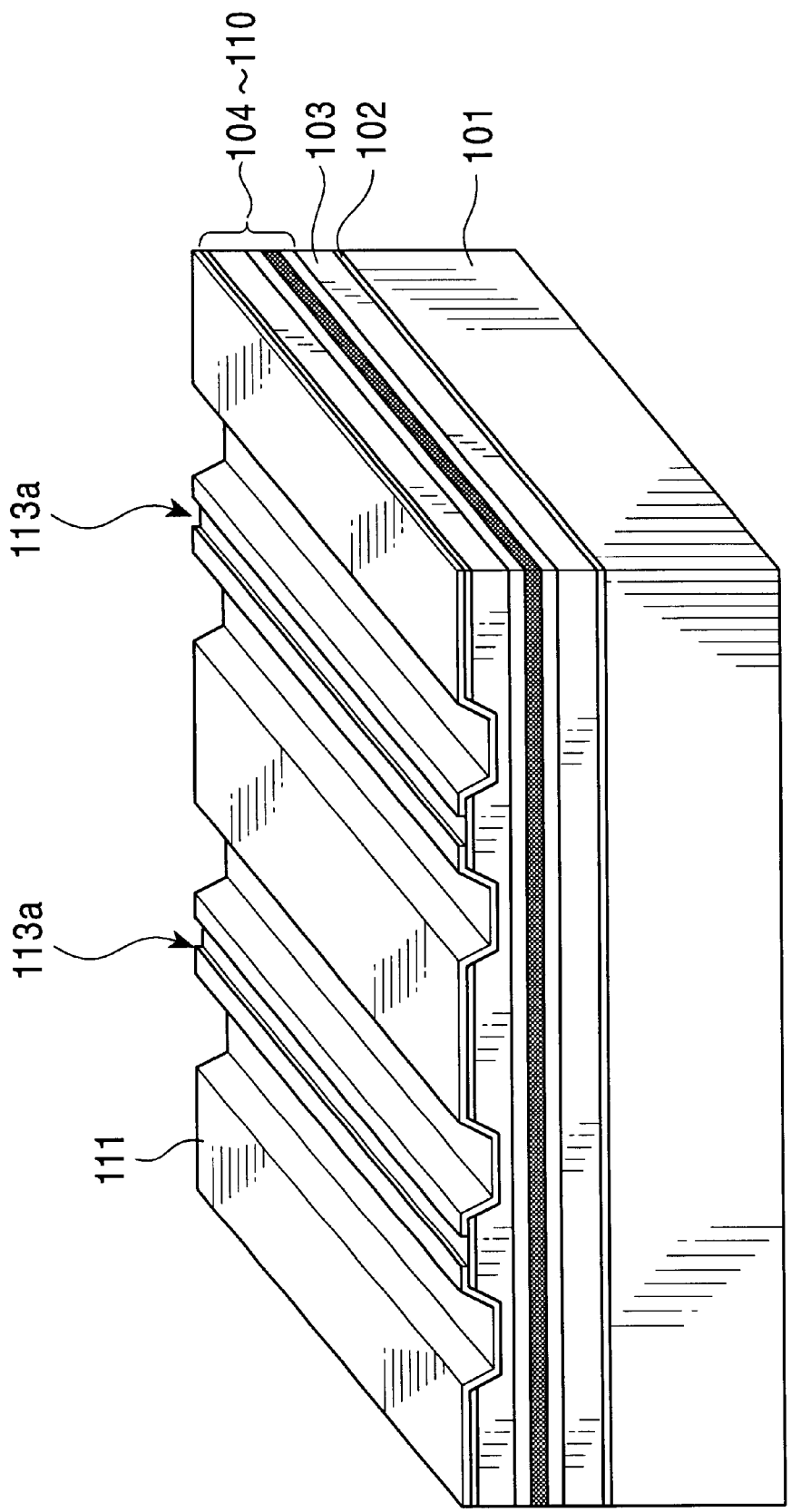

An SiO$_2$ protective film 111 is deposited on the wafer by sputtering as shown in FIG. 8.

Thereafter, a plurality of 3 μm-wide window portions 113a for n-type electrodes are formed at the tops of the ridge structures 118 in the SiO$_2$ protective film 111 by a standard photolithographic technique.

Figure 10:
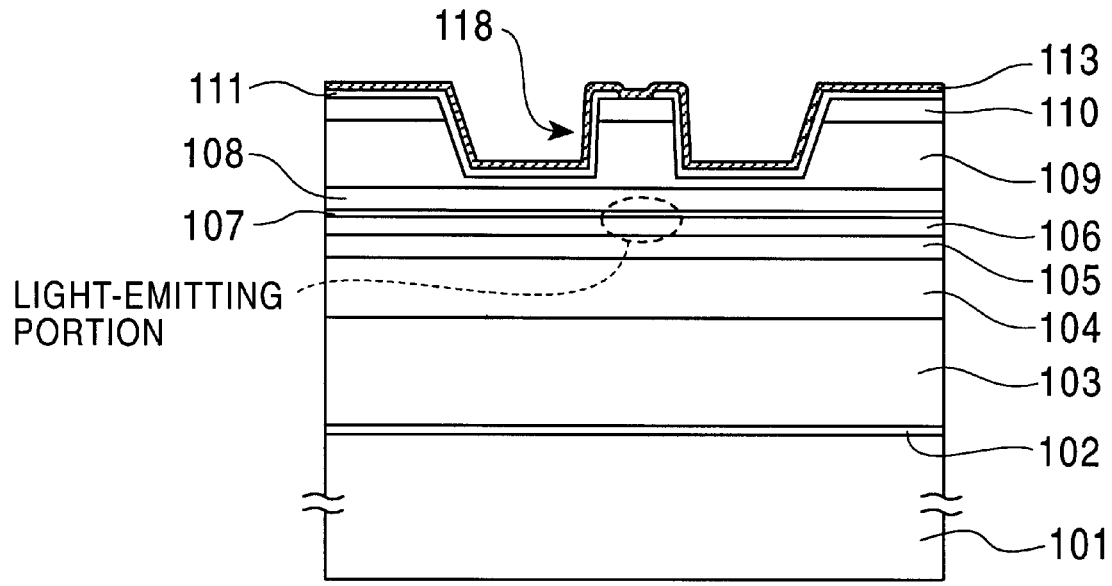
FIG. 10 is an enlarged schematic sectional view showing a wafer in the semiconductor-laser fabricating step of an embodiment of the present invention.

Nickel (Ni) with a thickness of 50 nm and subsequently Gold (Au) with a thickness of 200 nm are evaporated onto the SiO$_2$ protective film 111 and the portion where the p-type GaN contact layer 110 is exposed to form the p-side electrode 113. Thus, the device structures each shown in FIG. 10 are formed on the device wafer.

<Bonding of a Cleavable Substrate to the Wafer>

Figure 11:
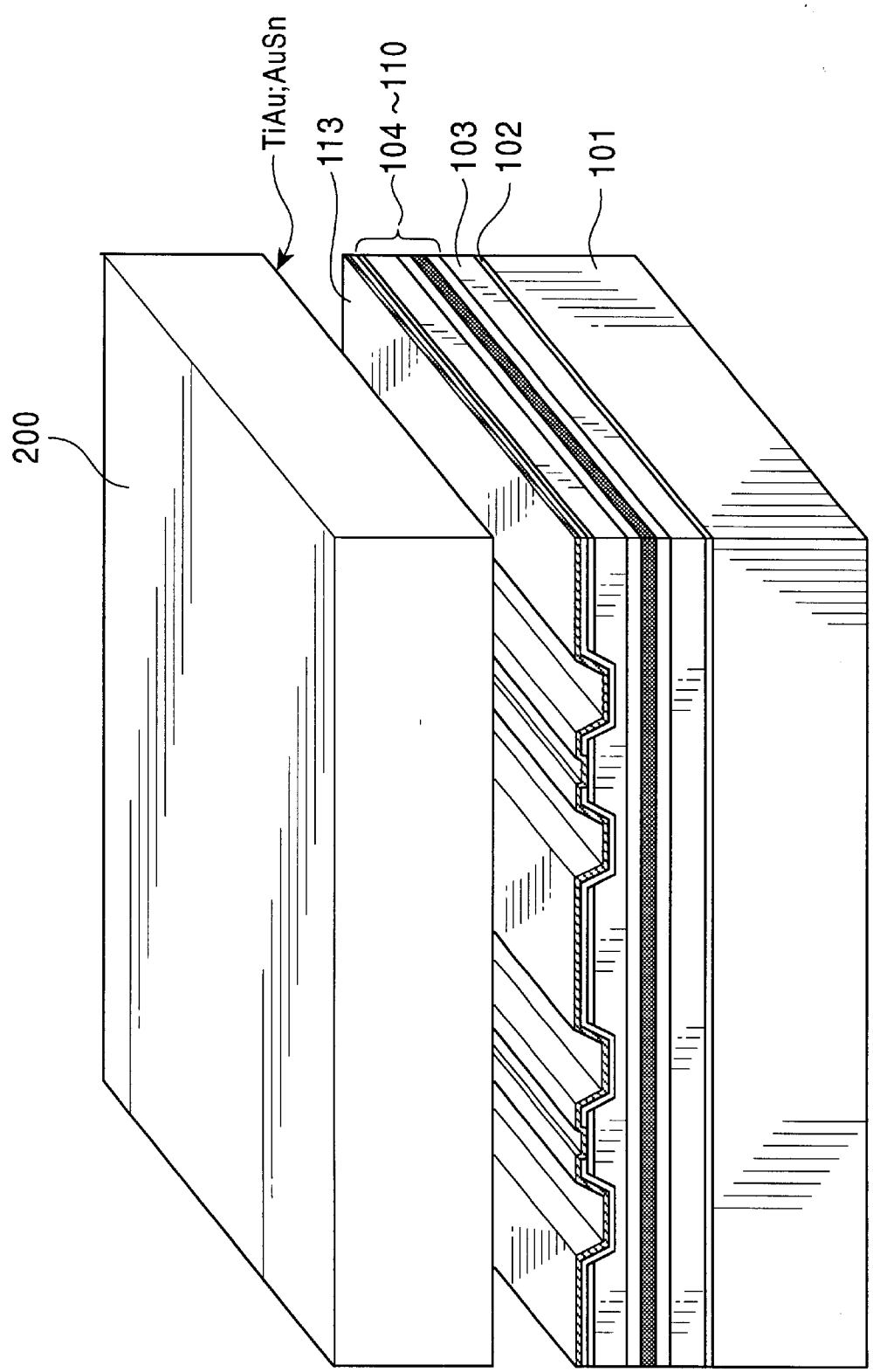
FIGS. 11 to 16 are schematic perspective views each showing a wafer in the semiconductor-laser fabricating step of an embodiment of the present invention.

Subsequently, as shown in FIG. 11, a GaAs single-crystal substrate 200 is bonded onto the p-side electrode 113 at the ridge waveguide side of the wafer as to be connected electrically to the laser structure. In this bonding step, the GaAs substrate 200 is aligned to the GaN laser structure in such a manner that the crystallographic orientation of the GaAs crystal substrate is set to be parallel to that of the GaN crystal layers, so that the cleavage of the GaAs crystal will coincide with the GaN cleavage plane in the next cleaving step wherein the desired laser resonator plane is formed by the cleavage of GaN crystal. A GaAs single-crystal substrate of p-type conductivity is used in this case. A Ti—Au thin film and Au—Sn thin film are previously formed in order by evaporation onto the surface of GaAs single-crystal substrate to be contacted to the p-side electrode 113 of the GaN crystal layer. The GaAs surface with the metal films and the electrode 113 are brought into contact, and then pressurized to achieve the bonding of both the substrates.

<Irradiation of Light from Sapphire Side to the Wafer>

Figure 12:
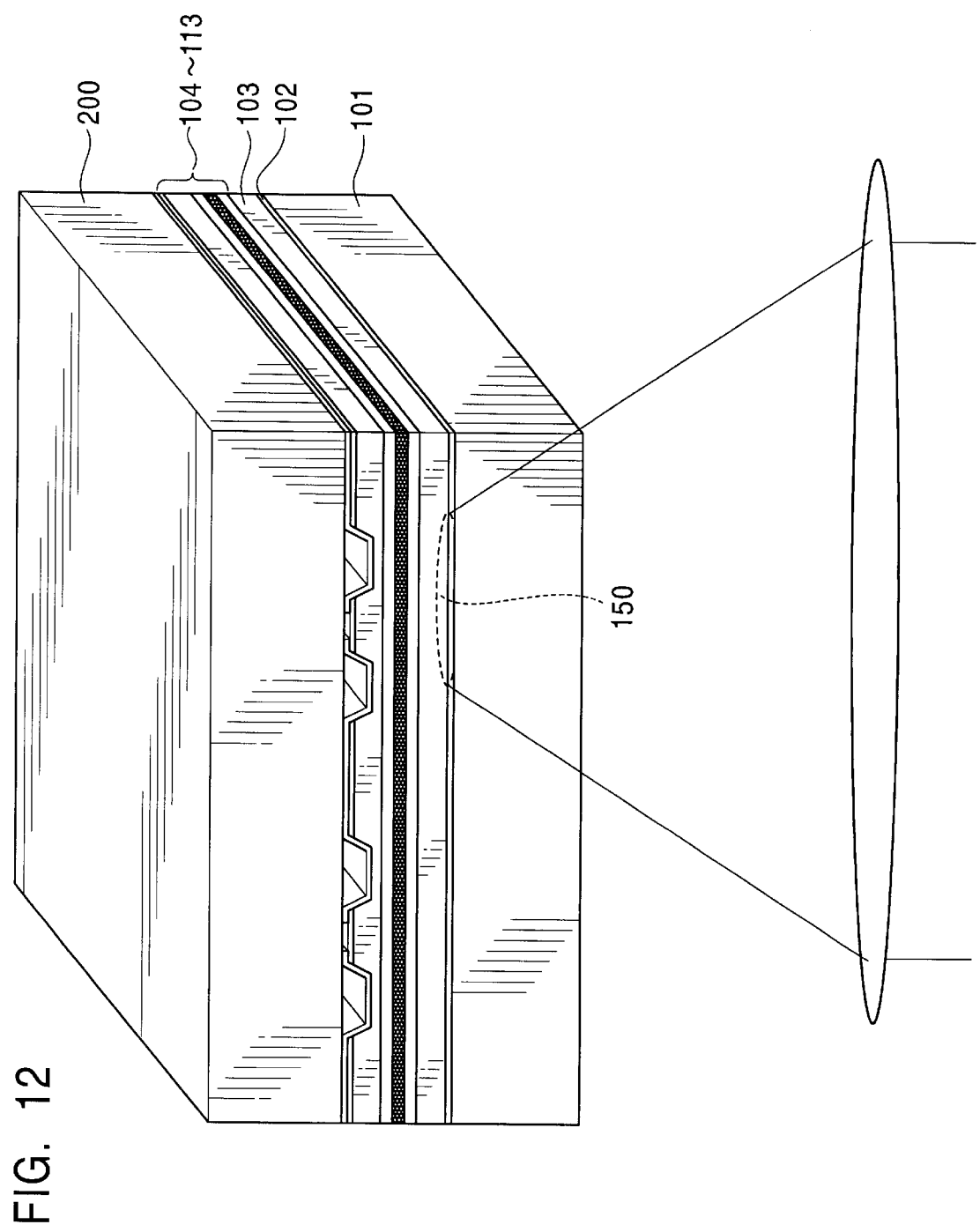

Subsequently, as shown in FIG. 12, the bonded wafer is irradiated from the backside of and through the sapphire substrate 101 to the ground layer 103 with a focused ultraviolet ray generated by a short-wavelength high output laser such as a frequency quadrupled YAG laser (with 266 nm wavelength), a KrF excimer laser (with 248 nm wavelength) or the like. The UV light beam may be applied uniformly onto the entire interface between the sapphire substrate 101 and the ground layer 103.

Whereas the sapphire substrate is almost transparent at 248 nm which is the wavelength of the laser beam used for the above UV irradiation, GaN of the ground layer absorbs the irradiation beam with a small penetration depth because it has an absorption edge of 365 nm. Moreover, because of a large lattice mismatch (15%) present between the sapphire substrate and the GaN layer, extremely dense defects are present in the GaN crystal nearby the interface and thereby, absorbed light is almost converted to heat. The temperature of an area of GaN nearby the sapphire substrate rapidly rises and thus, GaN is decomposed into gallium and nitrogen. Therefore, a decomposed-matter area 150 of the nitride semiconductor is produced at the interface region in the ground layer 103.

The decomposed-matter area 150 is provided for the purpose of promoting the crystal separation of the sapphire substrate 101 from the ground layer 103 of GaN and AlN. The sapphire substrate is used only for the manufacture of device. The wavelength of applied laser beam is selected from wavelengths absorbed by a GaN crystal layer and passing through the sapphire substrate. Therefore, as for the irradiated interface area in the GaN ground layer 103, direct crystal bonds between sapphire 101 and GaN 103 are disconnected. Thus the GaN ground layer 103 may be readily separated from the sapphire substrate 101 along the decomposed-matter area 150.

<Separation of Sapphire and Laser Wafers>

After that, the sapphire substrate 101 is slightly heated to separate the ground layer 103 with other crystal layers thereon from the sapphire substrate 101.

Figure 13:
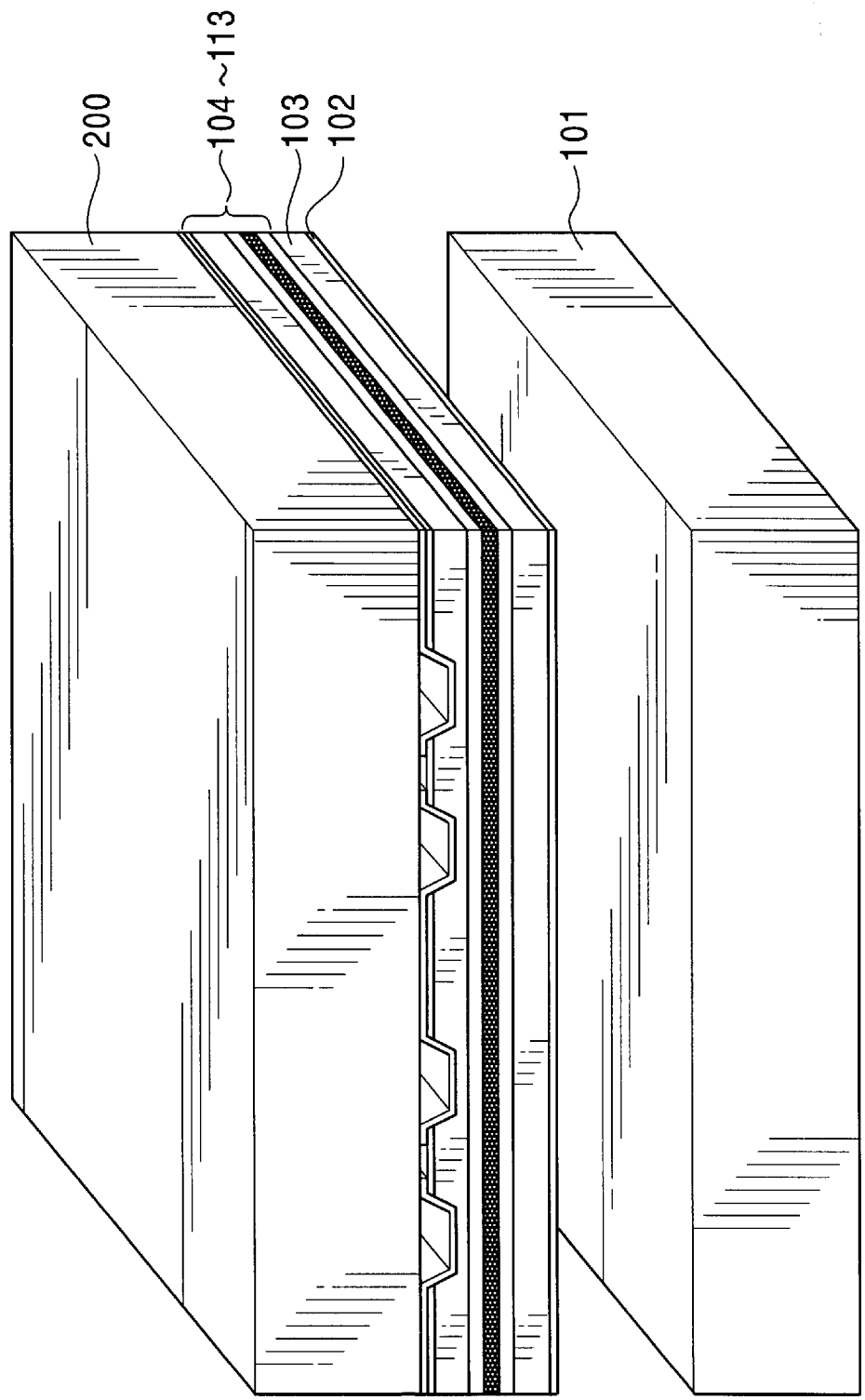

By this heating step, as shown in FIG. 13, the sapphire substrate 101 is removed from the lamination i.e., the laser wafer of the bonded laser body 100 and the support substrate 200, because atomic bonds between gallium and nitrogen are lost within the decomposed-matter area 150.

After the removal of the sapphire substrate 101, the exposed surface of the ground layer 103 is cleaned by dipping the laser wafer into a dilute hydrochloric acid solution or the like to remove residual metallic Ga therefrom.

Ti with a thickness of 50 nm and Au with a thickness 200 nm are successively evaporated onto the exposed surface of the laser wafer to form an n-side electrode 102.

The GaAs support substrate 200 may be thinned by lapping to facilitate to cleave the laser wafer. Ti/Au electrode is evaporated onto the surface of GaAs of the laser wafer.

<Cleaving of the Ground Layer>

Figure 14:
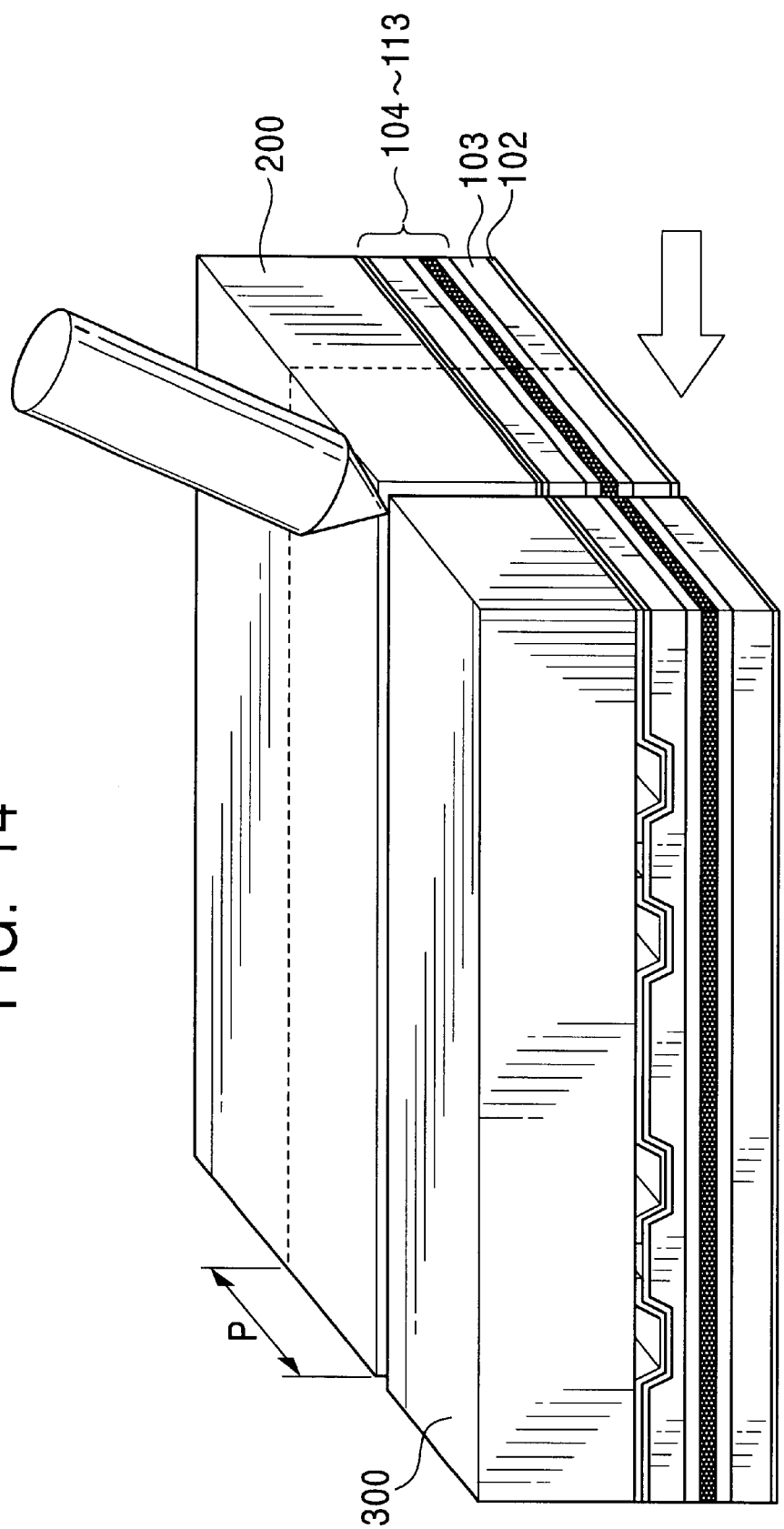

As shown in FIG. 14, in the case of the laser wafer of the bonded laser body 100 and the support substrate 200, the support substrate 200 is cleaved together with the ground layer 103 along the lines perpendicular to the ridge waveguide extending direction at an interval P which corresponds to the length of the final device.

At this cleaving step, the scribing (so-called notching operation) may be performed on the surface of the support substrate 200 by using a diamond point. As a result, a plurality of laser bars 300 are obtained.

<Reflection Coating on Laser Bar Side Surface>

Figure 15:
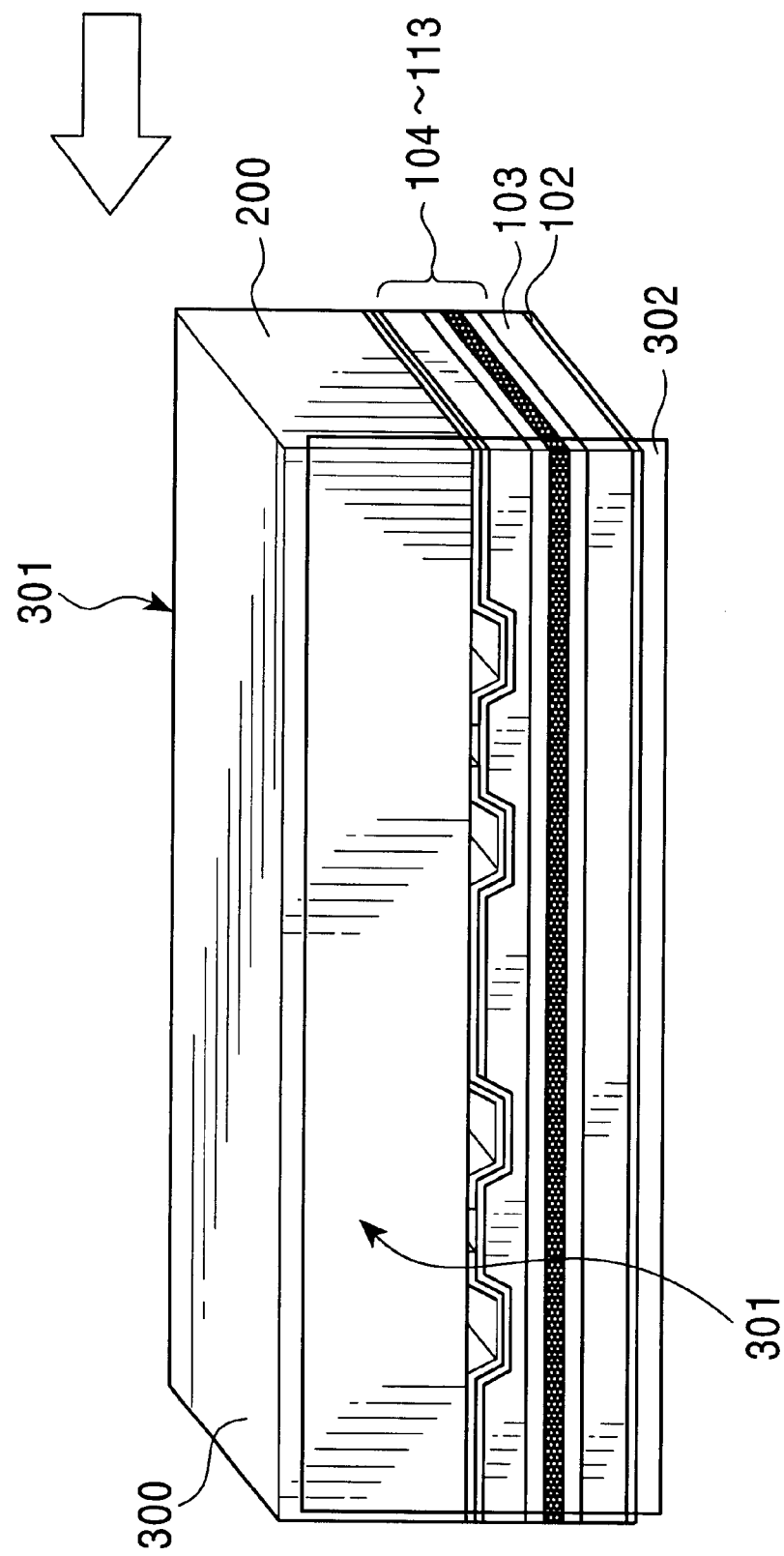

As shown in FIG. 15, dielectric multilayer reflection coatings 302 are formed on both the fracture planes (cleavage planes) 301 of each laser bar 300 by a sputtering system or the like.

<Formation of Laser-chips from Laser Bar>

Figure 16:
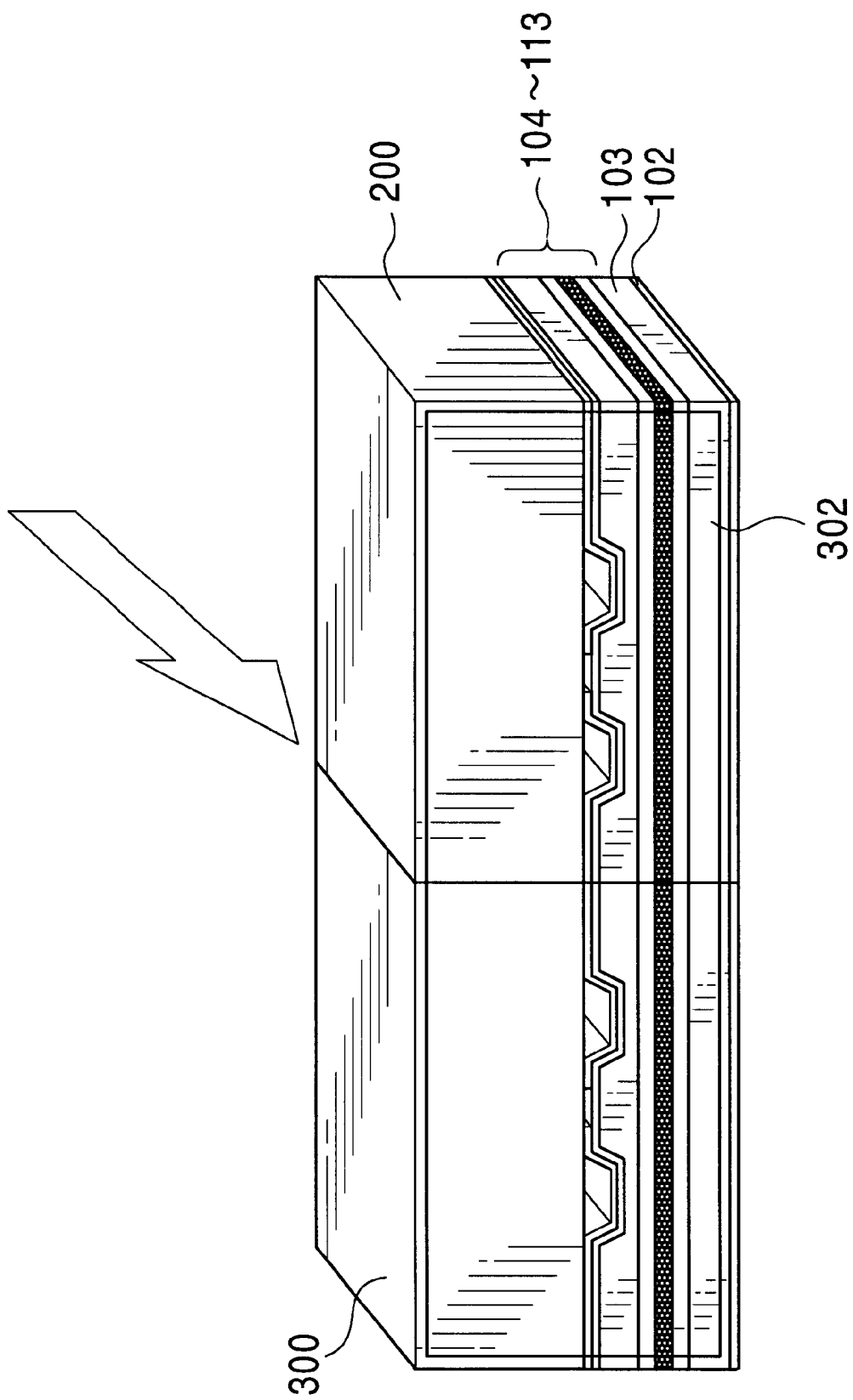

As shown in FIG. 16, individual laser chips are obtained by further splitting the laser bar by means of second cleavage along the direction parallel to the ridge waveguide extending direction.

<Assembling of Laser-chip>

Each laser-chip of the bonded laser body 100 and support substrate 200 is bonded via a Ti-Au thin film onto a chip carrier 10 serving as a heat sink in such a manner that the ground layer 103 of the laser body 100 is electrically connected to the chip carrier.

As described above, the laser structure formed on the A-face of a sapphire substrate is disclosed. In addition, the laser structure of ridge waveguide type may be formed on the C-face of the sapphire substrate.

<Secondary Embodiment>

The second embodiment to be fabricated is a group III nitride semiconductor laser device of a gain-guided type.

Figure 17:
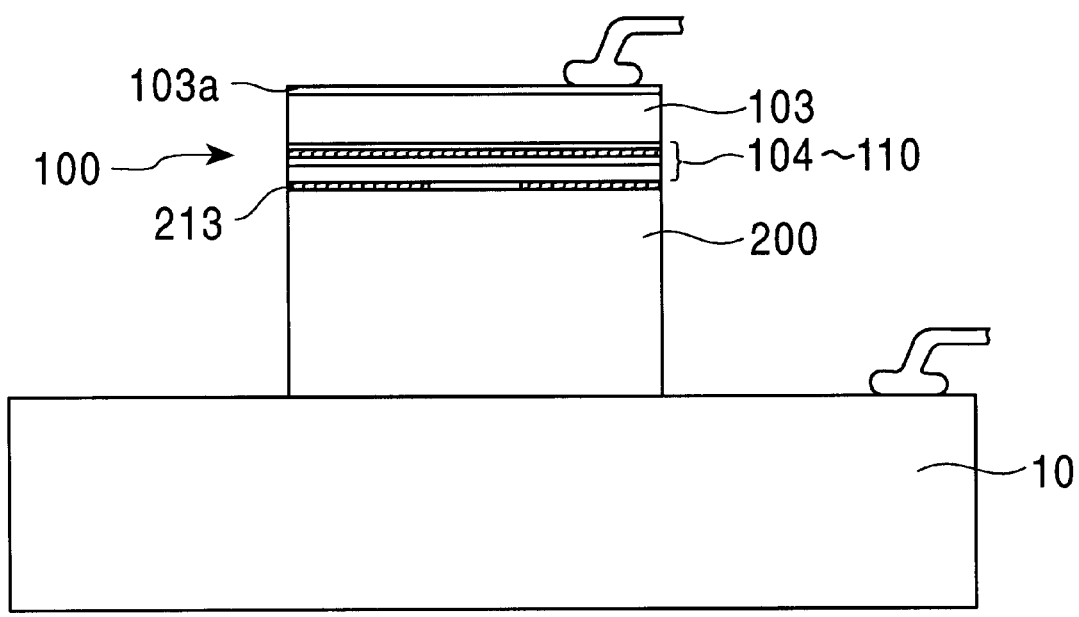
FIG. 17 is a schematic sectional view of a group III nitride-semiconductor laser device of another embodiment according to the present invention.
Figure 18:
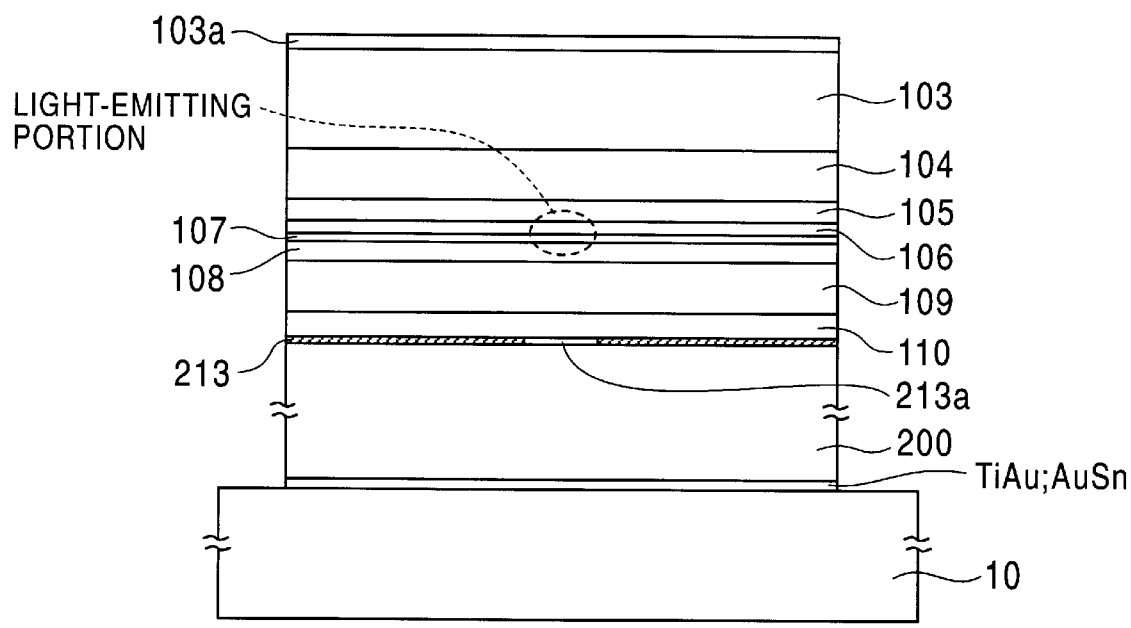
FIG. 18 is an enlarged schematic sectional view of a group III nitride-semiconductor laser device of another embodiment according to the present invention, which is seen from the mirror facet for optical resonance.

FIGS. 17 and 18 shows the gain-guided type group III nitride-semiconductor laser device of the second embodiment. The members of the device in those figures are the same as ones of the first embodiment shown in FIGS. 3 and 4.

This device of the second embodiment is constructed with a laser body 100, a support substrate 200 bonded onto the laser body 100, and an electrically conductive chip carrier 10 serving as a heat sink bonded onto the support substrate 200. The laser body 100 comprises crystal layers 104 to 110 each made of a group III nitride semiconductor $(Al_xGa_{1-x})_{1-y}In_yN$ ($0 \leq x \leq 1$, $0 \leq y \leq 1$) successively grown in order on the ground layer 103. An electrode layer 113a is formed on the n-type GaN ground layer 103 through which the device is electrically connected to an external electrode. Whereas, the p-type GaN contact layer 110 of the device is electrically connected through a stripe window 213a to the support substrate 200 and the chip carrier 10. A window film 213 made of GaAs oxide is formed between the laser body 100 and the support substrate 200. The GaAs oxide window film 213 is provided with the stripe window 213a of GaAs extending along a direction normal to the cleavage plane of the nitride semiconductor layers. The GaAs stripe 213a serves as an electric current passage between the laser body 100 and the support substrate 200. It is preferable that a joining metal film is provided between the GaAs oxide window film 213 and the p-type GaN contact layer 110 to bond the body 100 and the support substrate 200.

As shown in FIG. 18, the body 100 of the laser device includes a plurality of crystal layers from the n-type GaN layer 103 and the p-type GaN contact layer 110 which are layered as the same order as shown in FIG. 4. In this laser device, only the GaAs stripe 213a provides the electric current to the active semiconductor layer instead of the ridge waveguide formed in the cladding layer so that the device is the gain-guided type. The GaAs oxide film makes insulation between the laser body 100 and the support substrate 200 expect the GaAs stripe 213a.

The device structure shown in FIGS. 17 and 18 is fabricated in a similar manner as the first embodiment in which layered structure for the device is formed through the metal-organic chemical vapor deposition (MOCVD) on an A-face sapphire substrate.

First, the laser wafer with the GaN semiconductor laser structure shown in FIG. 5 is prepared on the basis of the sapphire substrate.

Figure 19:
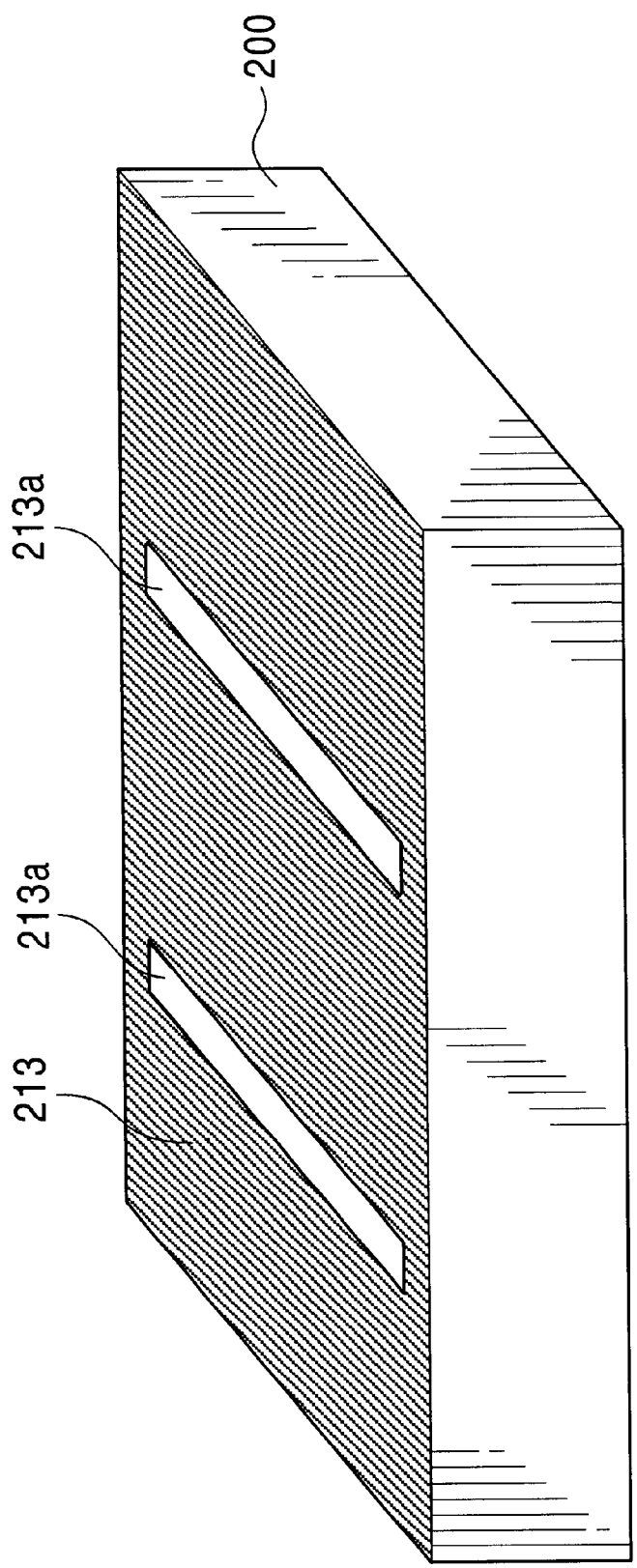
FIG. 19 is a schematic sectional view showing a portion of a GaAs substrate for the semiconductor laser device at each fabricating step of another embodiment of the present invention.

Whereas, a GaAs oxide window film 213 with a plurality of GaAs stripes 213a is formed on a GaAs single-crystal substrate 200 i.e., support substrate as shown in FIG. 19. The interval of GaAs stripes 213a is approximately 200 µm and the width of each stripe is approximately 2 to 5 µm for example. Those film and stripes may be formed in the following steps 1) to 6):

1) coating the surface of GaAs single-crystal substrate 200 with a photoresist;
2) irradiate pertinent light through a mask having stripe windows onto the photoresist layer;
3) developing the photoresist layer on the substrate;
4) settling the remaining photoresist down to the substrate to form given striped photoresist masks;
5) oxidizing the exposed surface of the GaAs substrate other than the stripe photoresist masks to form a GaAs oxide window film 213 with a plurality of GaAs stripes 213a. There are defined plural GaAs stripes 213a beneath the stripe photoresist masks; and
6) removing the stripe photoresist masks from the substrate.

In this way, the GaAs oxide window film 213 with a plurality of GaAs stripes 213a is formed on the GaAs support substrate.

Figure 20:
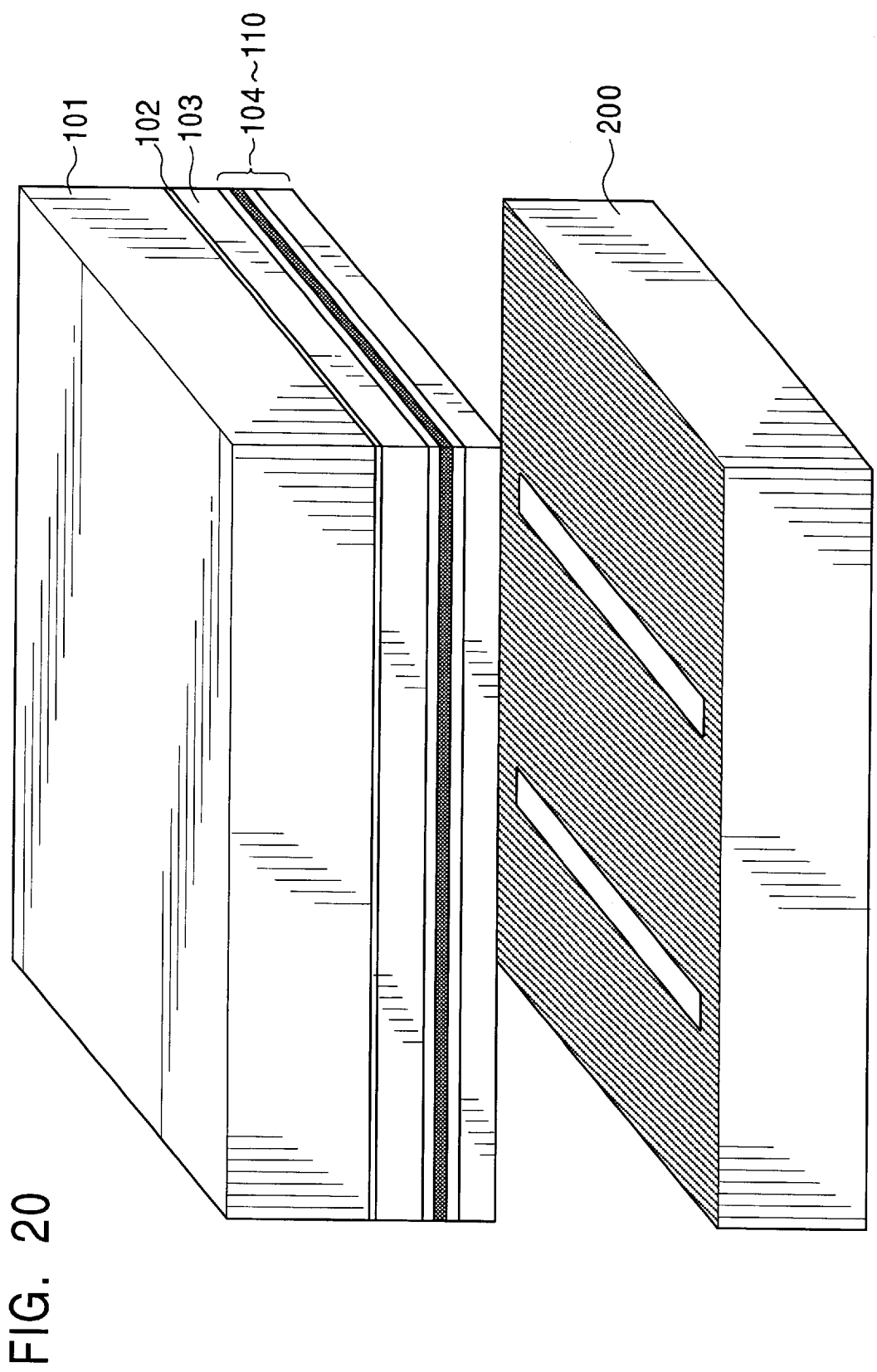
FIGS. 20 to 23 are schematic perspective views each showing a wafer in the semiconductor-laser fabricating step of another embodiment of the present invention.

Subsequently, as shown in FIG. 20, the GaAs support substrate of GaAs single-crystal 200 is bonded onto the p-type GaN contact layer 110 of the wafer via the GaAs oxide window film 213 with a plurality of GaAs stripes 213a as to be connected electrically to the laser structure. In this bonding step, the GaAs substrate 200 is aligned to the GaN laser structure in such a manner that the crystallographic orientation of the GaAs crystal substrate is parallel to or coincides with that of the GaN crystal layers, so that there will be appearance of the GaAs cleavage surface or fractured plane matched for the GaN one in the next cleaving step wherein a given laser resonator consists of the GaN cleavage surface of the crystal layer.

Figure 24:
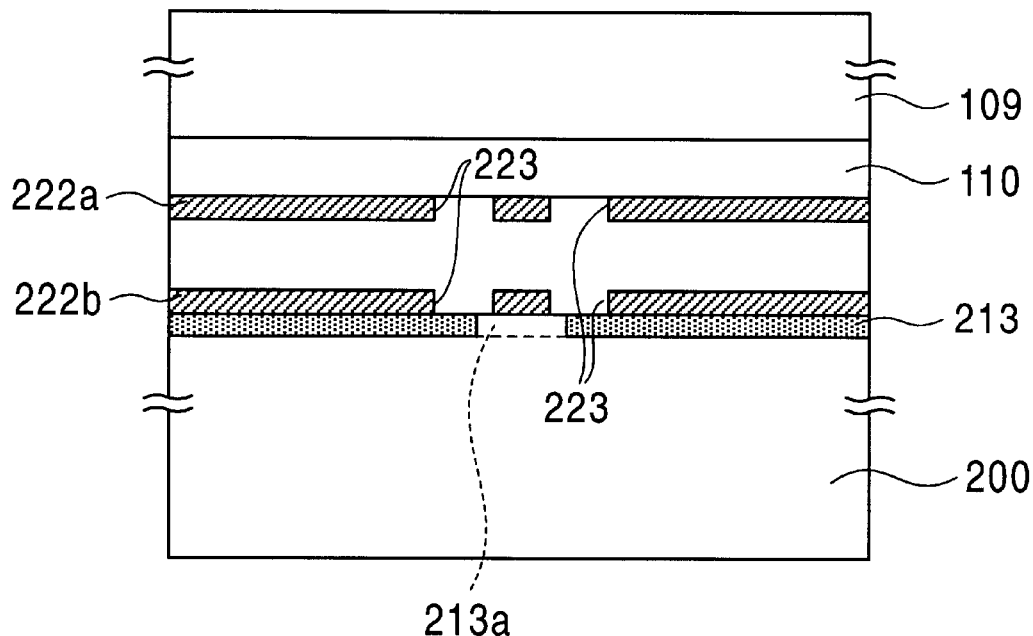
FIGS. 24 and 25 are enlarged schematic sectional views each showing a wafer in the semiconductor-laser fabricating step of an embodiment of the present invention.
Figure 25:
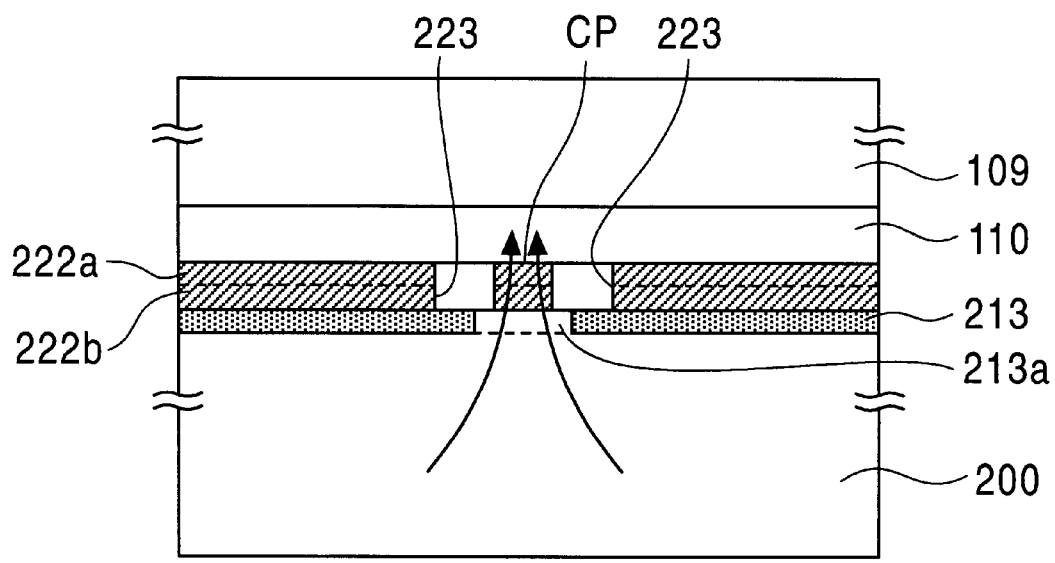

A thin metal film such as In, Ni or the like may be previously formed by evaporation on at least one of contacting surfaces of GaAs oxide film 213 on the substrate 200 and the p-type GaN contact layer 110 of the wafer in order that both the substrates come contact with each other via the thin metal film sandwiched between the p-type GaN contact layer 110 and the GaAs oxide window film 213. In this case, as shown in FIG. 24, it is preferable that the joining thin metal films 222a and 222b are provided on the GaAs single-crystal substrate 200 and the p-type GaN contact layer 110 respectively in which slits 223 with an about 10 µm width are formed along the edges of the GaAs stripe 213a in the GaAs oxide film 213. That is, as shown in FIG. 25, the slits 223 define a narrowed current path CP of metal from the GaAs substrate 200 through the GaAs stripe 213a to the p-type GaN contact layer 110, when the joining thin metal films 222a and 222b are fused in the next step.

Anyway, the bonding surface of the support substrate is made contact with the surface of cladding layer opposite to the ground layer 103 with respect to the active layer of the laser wafer while being pressurized and heated, and then close adhesion of both the substrates is achieved.

Figure 21:
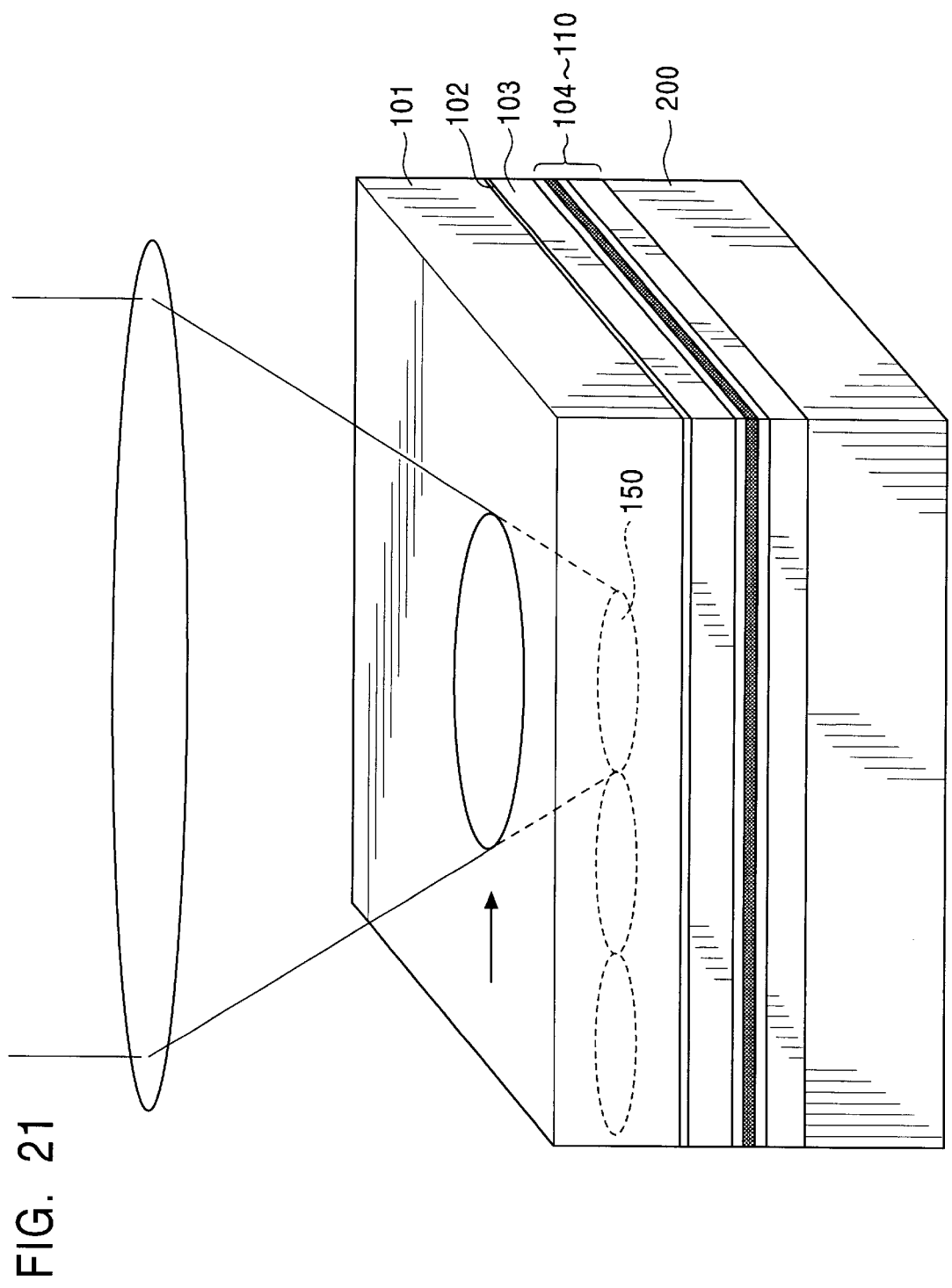

Subsequently, as shown in FIG. 21, an ultraviolet ray is irradiated through the sapphire substrate 101 to the ground layer 103 by using a short-wavelength high output laser device. Namely the UV radiation is performed from the backside of sapphire substrate while being converged by a converging lens. Since GaN absorbs UV light, the temperature of the area of GaN nearby the sapphire substrate suddenly rises and thus, GaN is decomposed into gallium and nitrogen, so that the decomposed-matter area 150 of the nitride semiconductor is produced along the light trace.

Figure 22:
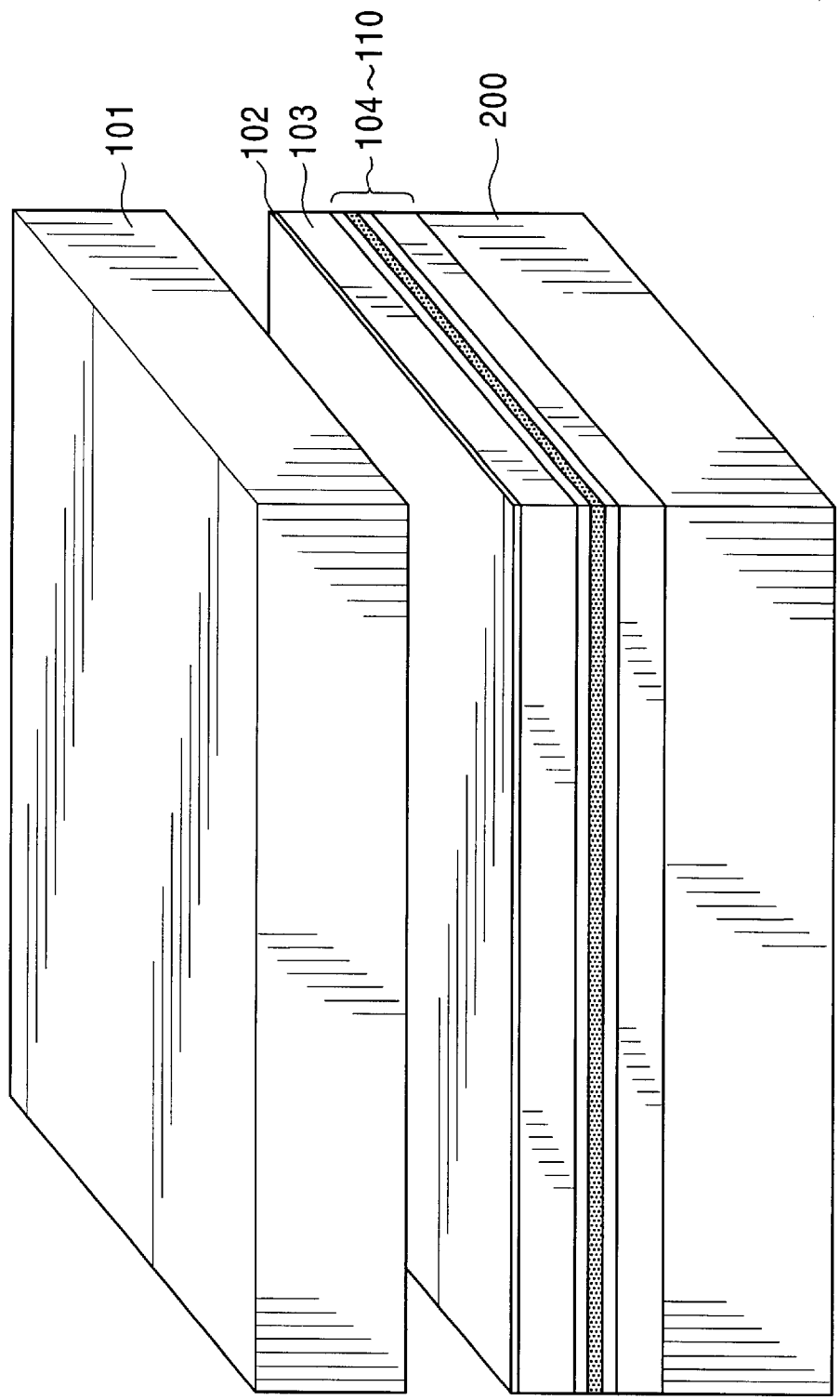
Figure 23:
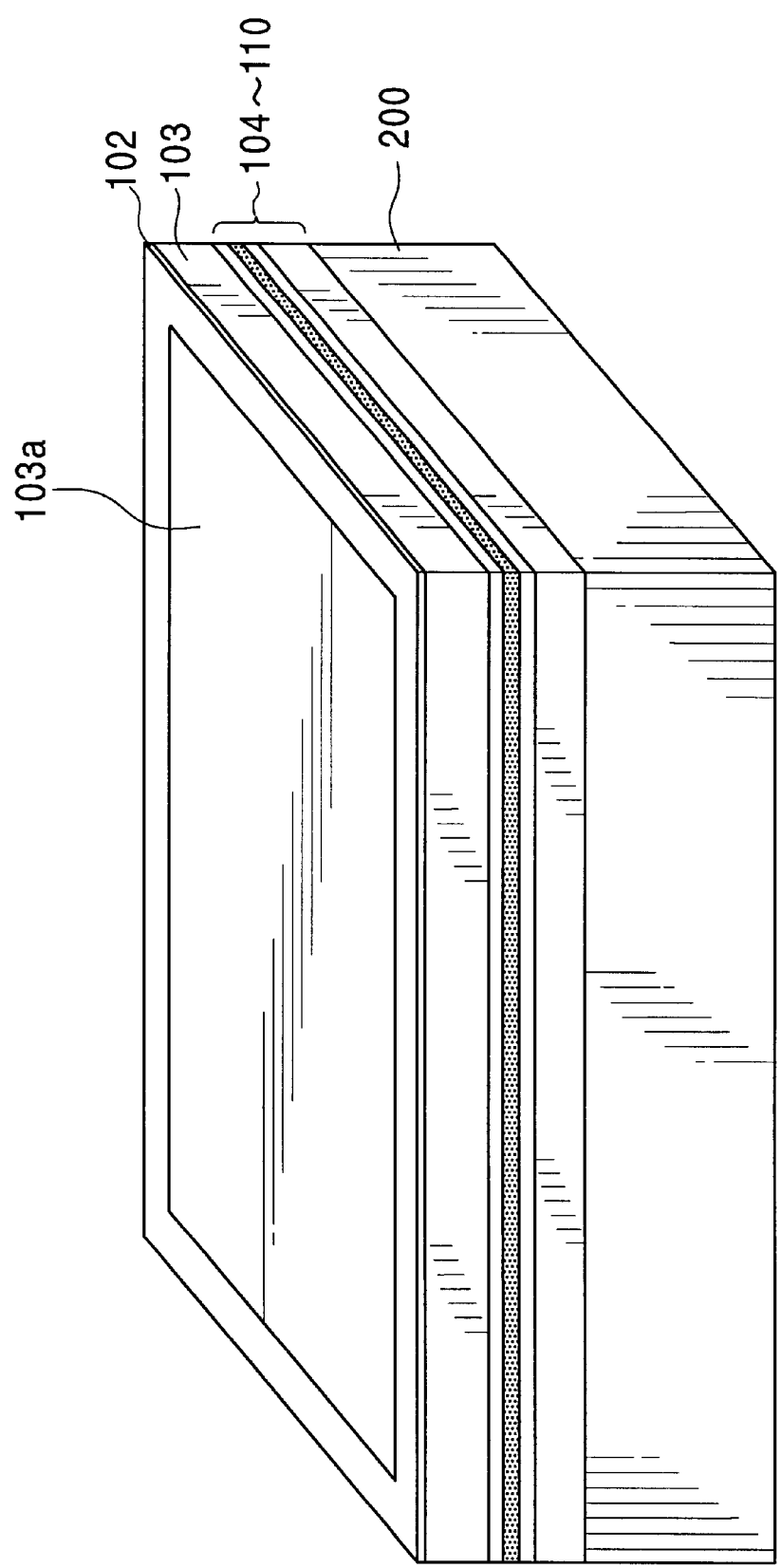

After that, the sapphire substrate 101 carrying the GaN layers is slightly heated and then, as shown in FIG. 22, the sapphire substrate 101 is removed from the lamination i.e., laser wafer of the bonded laser body 100 and support substrate 200 at the boundary of the decomposed-matter area 150 of the ground layer 103.

Then, an n-side electrode layer 103a is formed on the exposed surface of the GaN ground layer 103 of the laser body 100.

After that, the cleaving step, the reflection layer formation step and the assembling step are preformed in turn and then the semiconductor laser device as shown in FIGS. 17 and 18.

According to the present invention, it is possible to utilize the natural cleavage plane of nitride semiconductor for fabricating the resonator of the device by removing the substrate for the crystal growth. An atomically flat mirror facet is easily obtained, thereby reducing the optical scattering loss. As a result, continuous oscillation of laser is achieved and the same time a long life of the laser device is obtained in practical.

What is claimed is:

1. A nitride semiconductor laser device comprising:

a ground layer made of group III nitride semiconductor $(Al_{x'}Ga_{1-x'})_{1-y'}In_{y'}N$ ($0 \leq x' \leq 1$, $0 \leq y' \leq 1$);

a laser body including a plurality of crystal layers each made of group III nitride semiconductor $(Al_xGa_{1-x})_{1-y}In_yN$ ($0 \leq x \leq 1$, $0 \leq y \leq 1$) successively grown on the ground layer, the laser body further including a narrowed current path to provide electric current to a light emitting portion of the crystal layers;

a cleavable support substrate bonded after growth of the crystal layers onto a surface of the laser body where the narrowed current path is disposed, wherein the cleavable support substrate has a cleavage plane coinciding with a cleavage plane of the crystal layers of the nitride semiconductor and wherein the cleavable support substrate is made of an electrically conductive material; and at least one bonding film, via which the cleavable support substrate and the laser body are bonded, including a portion of the narrowed current.

2. A nitride semiconductor laser device according to claim 1, wherein the device further comprises a heat sink bonded onto the ground layer.

3. A nitride semiconductor laser device according to claim 1, wherein the device further comprises a heat sink bonded onto the cleavable support substrate.

4. A nitride semiconductor laser device according to claim 1, wherein the device further comprises a waveguide extending along a direction normal to a cleavage plane of the nitride semiconductor.

5. A nitride semiconductor laser device according to claim 1, wherein the cleavable support substrate is made of a semiconductor single-crystal material.

6. A nitride semiconductor laser device according to claim 5, wherein the semiconductor single-crystal material is selected from a group consisting of GaAs, InP and Si.

7. A nitride semiconductor laser according to claim 1, wherein the narrowed current path includes a conductive stripe extending along a direction normal to the cleavage plane of the nitride semiconductor.

8. A nitride semiconductor laser device according to claim 1, wherein the bonding film comprising a metal film.

* * * * *